US012570816B2

(12) United States Patent　　　　(10) Patent No.:　US 12,570,816 B2
Spiegelman et al.　　　　　　　　　(45) Date of Patent:　Mar. 10, 2026

(54) HYDROGEN PEROXIDE PLASMA SURFACE MODIFICATION

(71) Applicant: RASIRC, Inc., San Diego, CA (US)

(72) Inventors: Jeffrey J. Spiegelman, San Diego, CA (US); Gaku Tsuchibuchi, Boulder, CO (US); Hayato Murata, Ibaraki (JP); Hiroshi Taka, Ibaraki (JP)

(73) Assignee: RASIRC, Inc., San Diego, CA (US)

( * ) Notice: Subject to any disclaimer, the term of this patent is extended or adjusted under 35 U.S.C. 154(b) by 47 days.

(21) Appl. No.: 18/586,926

(22) Filed: Feb. 26, 2024

(65) Prior Publication Data

US 2024/0301155 A1　　Sep. 12, 2024

Related U.S. Application Data

(60) Provisional application No. 63/488,579, filed on Mar. 6, 2023.

(51) Int. Cl.
*C09C 1/28*　　　　(2006.01)
*C08J 7/12*　　　　(2006.01)
*C09C 3/04*　　　　(2006.01)
*C23C 14/02*　　　　(2006.01)
*C23C 16/02*　　　　(2006.01)

(52) U.S. Cl.
CPC ................ *C08J 7/123* (2013.01); *C09C 1/28* (2013.01); *C09C 3/048* (2013.01); *C08J 2323/30* (2013.01); *C08J 2327/22* (2013.01); *C08J 2367/02* (2013.01); *C08J 2371/08* (2013.01); *C23C 14/02* (2013.01); *C23C 16/02* (2013.01)

(58) Field of Classification Search
CPC .... C08J 7/123; C08J 2323/30; C08J 2327/22; C08J 2367/02; C08J 2371/08; C09C 1/28; C09C 3/048; A61L 2/14; A61L 2/208
See application file for complete search history.

(56) References Cited

U.S. PATENT DOCUMENTS

| | | | | |
|---|---|---|---|---|
| 4,643,876 | A * | 2/1987 | Jacobs | ...................... A61L 2/14 |
| | | | | 422/23 |
| 10,595,967 | B2 * | 3/2020 | Homann | ................ A61K 6/822 |
| 2010/0208196 | A1 | 8/2010 | Benrashid et al. | |
| 2014/0206200 | A1 | 7/2014 | Nelson | |

(Continued)

FOREIGN PATENT DOCUMENTS

| | | |
|---|---|---|
| JP | 2008135286 A | 6/2008 |
| WO | 2015154613 A1 | 10/2015 |

OTHER PUBLICATIONS

"3 Ways to Increase Plasma Uniformity," Plasma Etch, Inc., Jul. 2003. On-line: https://www.circuitnet.com/news/uploads/3/3_Ways_to_Increase_Plasma_Uniformity_1.pdf.

(Continued)

*Primary Examiner* — Michael P Wieczorek

(74) *Attorney, Agent, or Firm* — MLO, a professional corp.

(57)　　　　ABSTRACT

The techniques described herein relate to hydrogen peroxide plasma surface modification. In some embodiments, a method includes providing a mixture including hydrogen peroxide vapor from a source, wherein a concentration of the hydrogen peroxide vapor in the mixture is substantially stable over time. The method further includes forming a hydrogen peroxide plasma from the mixture and exposing a material to the hydrogen peroxide plasma in a chamber.

18 Claims, 13 Drawing Sheets

(56) References Cited

U.S. PATENT DOCUMENTS

| | | | | |
|---|---|---|---|---|
| 2017/0312376 | A1* | 11/2017 | Bae | H05H 1/48 |
| 2020/0367996 | A1* | 11/2020 | Berner | A61L 2/14 |
| 2020/0393086 | A1 | 12/2020 | Blethen et al. | |

OTHER PUBLICATIONS

"Amorphous vs. Crystalline Polyester Film," Tech Tip, Terka, LLC, 2023. Accessed: Feb. 2023. On-line: https://www.tekra.com/sites/default/files/downloads/Tek-Tip-Amorphous-vs-Semi-Crystalline-Polyester.pdf.

"Controlled Chemical Plasma Etching for Advanced Technology Applications—Application Note," Nordson Electronic Solutions, March Products, Mar. 2022. On-line: https://azcscxpprodcdn.azureedge.net/-/media/Files/Nordson/march/Papers/Controlled-Chemical-Plasma-Etching-for-Advanced-Technology-Applications-NordsonMARCH.pdf?la=en&rev=169c8050506d445c80857b60c3b9d373.

"Etch Performance: 9 Factors to Consider," Corial, a Plasma-Therm Company, Blog, Oct. 6, 2020. On-line: https://corial.plasmatherm.com/en/blog/etch-performance-9-factors-to-consider.

Abusrfa, et al, "Modification of Polyethylene in RF Plasma in Different/Mixture Gases," Coatings, Feb. 2019 (vol. 9, Issue 2). On-line: https://www.mdpi.com/2079-6412/9/2/145.

Afeyan et al, "Flow-through particles for the high-performance liquid chromatographic separation of biomolecules: perfusion chromatography," Journal of Chromatography, 519 (1990) 1-29. https://pubmed.ncbi.nlm.nih.gov/2077042/.

Aghaee, et al., Low temperature temporal and spatial atomic layer deposition of TiO2 films, American Vaccum Society, Jun. 17, 2015, 10 pgs, Journal of Vacuum Science and Technology A, Netherlands.

Antonellia et al., "Patterning with Amorphous Carbon Thin Films," ECS Transactions, 35 (4) pp. 701-716 (Jan. 2011) The Electrochemical Society. On-line: https://www.researchgate.net/publication/264938015_Patterning_with_Amorphous_Carbon_Thin_Films.

Awaja, et al., Cell Adhesion to PEEK Treated by Plasma Immersion Ion Implantation and Deposition for Active Medical Implants, Plasma Process, 2012, Wiley Online Library.

Chabal et al., Silanone (Si═O) on Si(100): intermediate for initial silicon oxidation, Physical Review B 66, Oct. 2002, 161315-1-161315-4.

Grabbe et al., Strained Siloxane Rings on the Surface on Silica: Their Reaction with Organosiloxanes, Organosilanes, and Water, J. Phys. Chem. vol. 99, No. 13, Jan. 1995, pp. 4648-4654.

Habib et al., Atmospheric oxygen plasma activation of silicon (100) surfaces, J. Vac. Sci. Technol. A 28, Apr. 2010, pp. 476-485.

Kurtz, et al, PEEK Biomaterials in Trauma, Orthopedic, and Spinal Implants, Biomaterials, Aug. 7, 2007, 54 pgs, vol. 28, Issue 32.

Lauren, "Plasma treatment and hydrophobic recovery of polymers," Blog, Biolin Scientific, Oct. 2020. On-line: https://www.biolinscientific.com/blog/plasma-treatment-and-hydrophobic-recovery-of-polymers.

Liang, et al., Biocompatible Interface Films Deposited within Porous Polymers by Atomic Layer Deposition (ALD), Sept. 2, 2009, 8 pgs, vol. 1 No. 9, ACS Applied Materials and Interfaces, Boulder, Colorado.

Ma, et al., Current Strategies to Improve the Bioactivity of PEEK, Mar. 28, 2014, International Journal of Molecular Sciences, Shanghai, China.

Moringo, Hao Shen, Lawrence J. Tauzin, Wenxiao Wang, Logan D. C. Bishop, and Christy F. Landes, "Variable lysozyme transport dynamics on oxidatively functionalized polystyrene films," Langmuir Sep. 2017, 33, 41, 10818-10828. https://pubs.acs.org/doi/pdf/10.1021/acs.langmuir.7b02641#.

Nedela, et al., Surface Modification of Polymer Substrates for Biomedical Applications, Licensee MDPI, Sep. 21, 2017, 22 pgs, Department of Solid State Engineering, University of Chemistry and Technology, Basel, Switzerland.

North et al., "Plasma-Based Surface Modification of Polystyrene Microtiter Plates for Covalent Immobilization of Biomolecules," Applied Materials and Interfaces, vol. 2, No. 10, pp. 2884-2891, Sep. 2010.

Pareta, et al., An understanding of enhanced osteoblast adhesion on various nanostructured polymeric and metallic materials prepared by ionic plasma deposition, Mar. 25, 2009, Wiley Online Library.

Primc and Mozetic, "Hydrophobic Recovery of Plasma-Hydrophilized Polyethylene Terephthalate Polymers," Polymers, Jun. 2022 (vol. 14, Issue 12). On-line: https://www.mdpi.com/2073-4360/14/12/2496.

Primc, "Recent Advances in Surface Activation of Polytetrafluoroethylene (PTFE) by Gaseous Plasma Treatments," Polymers, Oct. 2020 (vol. 12, Issue 10). On-line: https://www.mdpi.com/2073-4360/12/10/2295.

Rao, et al., Spine Interbody Implants: Material Selection and Modification, Functionalization and Bioactivation of Surfaces to Improve Osseointegration, Feb. 18, 2014, 9 pgs, vol. 6, Chinese Orthopaedic Association and Wiley Publishing Asia Pty Ltd, Australia.

Reising, et al., Greater osteoblast long-term functions on ionic plasma deposited nanostructured orthopedic implant coatings, Dec. 17, 2007, 6 pgs, Wiley Periodicals, Inc.

Schlenoff, Zwitteration: Coating Surfaces with Zwitterionic Functionality to Reduce Nonspecilc Adsorption, Apr. 22, 2014, 64 pgs, American Chemical Society, Washington, DC.

Smith, "The Infrared Spectra of Polymers IV: Rubbers," Spectroscopy, Jan. 2022 (vol. 37, Issue 1). On-line: https://www.spectroscopyonline.com/view/the-infrared-spectra-of-polymers-iv-rubbers.

Tsougeni et al., "High-capacity and high-intensity DNA microarray spots using oxygen-plasma nanotextured polystyrene slides," Anal Bioanal Chem (May 2012) 403:2757-2764 https://vdocuments.mx/download/high-capacity-and-high-intensity-dna-microarray-spots-using-oxygen-plasma-nanotextured.html.

Wang, et al., Enhanced osteoblast responses to poly ether ether ketone surface modified by water plasma immersion ion implantation, Feb. 18, 2014, 9 pgs, Elsevier B.V., Netherlands.

Zander, et al., Antimicrobial and Antifouling Strategies for Polymeric Medical Devices, Dec. 14, 2017, 10 pgs, ACS Publications, Akron, Ohio.

Zhu et al., "Bioinspired superwetting surfaces for biosensing," View, Feb. 2021 (vol. 1, Issue 2). On-line: https://onlinelibrary.wiley.com/doi/10.1002/VIW.20200053.

International Search Report and Written Opinion dated May 24, 2024 for PCT Patent Application No. PCT/IB2024/051826.

Rutala et al., "Comparative evaluation of the sporicidal activity of new low-temperature sterilization technologies: ethylene oxide, 2 plasma sterilization systems, and liquid peracetic acid," Am J Infect Control, Aug. 1998;26(4):393-8.

* cited by examiner

Table 1: Hydrogen peroxide plasma generation

| Test ID | Carrier Gas | | $H_2O_2$ Plasma Ignition |
|---|---|---|---|
| | Ar [sccm] | $O_2$ [sccm] | |
| A | 5000 | 0 | Stable |
| B | 4000 | 1000 | Stable |
| C | 3000 | 2000 | Unstable |
| D | 0 | 5000 | Unstable |

FIG. 1B

Table 2: Experimental parameters and results for Examples 1-11

| Example | Treatment Conditions | Temp [C] | Resulting WCA |
|---|---|---|---|
| 1 | $H_2O_2$/Ar Plasma | 150 | |
| 2 | $H_2O_2$/Ar Plasma | 200 | 4.0° |
| 3 | $H_2O_2$/$O_2$/Ar Plasma ($O_2$=1000sccm) | 150 | |
| 4 | $H_2O_2$/$O_2$/Ar Plasma ($O_2$=1000sccm) | 200 | |
| 5 | $H_2O_2$/$O_2$/Ar Plasma ($O_2$=270sccm) | 200 | |
| 6 | $H_2O$/Ar Plasma | 150 | |
| 7 | $H_2O$/Ar Plasma | 200 | 6.5° |
| 8 | $H_2O$/$O_2$/Ar Plasma ($O_2$=340sccm) | 200 | |
| 9 | $O_2$ Plasma (680sccm) | 200 | 27.5° |
| 10 | Thermal $H_2O_2$ | 150 | 47.5° |
| 11 | Thermal $H_2O_2$ | 300 | 11.5° |

FIG. 1C

Table 3: Experimental parameters for Examples 12-15 (see Table 4 for pressure and power conditions for each type of plasma).

| Example | Polymer | Plasma Inputs | WCA Data |
|---------|---------|---------------|----------|
| 12 | HDPE | $O_2$, $H_2O_2/N_2$ and $H_2O_2/O_2$ | FIGs. 11A-11C |
| 13 | PET | $O_2$, $H_2O_2/N_2$ and $H_2O_2/O_2$ | FIGs. 12A-12C |
| 14 | PVDF | $O_2$, $H_2O_2/N_2$ and $H_2O_2/O_2$ | FIGs. 13A-13C |
| 15 | PTFE | $O_2$, $H_2O_2/N_2$ and $H_2O_2/O_2$ | FIGs. 14A-14C |

FIG. 1D

Table 4: Hydrogen peroxide plasma conditions for Examples 12-15.

| 1 (LH) | 2 (HH) | Pressure | |
|--------|--------|----------|---|
| 3 (LL) | 4 (HL) | Low | High |
| RF Power High | | 200 mTorr 100 watt | 375 mTorr 100 watt |
| Low | | 200 mTorr 50 watt | 375 mTorr 50 watt |

FIG. 1E

Before pre-treatment

After pre-treatment

Contact
Angle

1. $H_2O_2$/Ar Plasma @150C

2. $H_2O_2$/Ar Plasma @200C

6. $H_2O$/Ar Plasma @150C

7. $H_2O$/Ar Plasma @200C

HYDROGEN PEROXIDE PLASMA SURFACE MODIFICATION

RELATED APPLICATIONS

This application claims the benefit of U.S. Provisional Patent Application No. 63/488,579, filed on Mar. 6, 2023, and entitled "Hydrogen Peroxide Plasma Surface Modification"; which is hereby incorporated by reference for all purposes.

BACKGROUND

Surface modification of a material to convert a hydrophobic surface to a hydrophilic surface is useful in various technological applications and industries.

For example, semiconductor manufacturing processes can include using silicon substrates with the native oxide removed (and the surface terminated with hydrogen atoms), which have relatively hydrophobic surfaces. Conventional methods to increase the hydrophilicity of a clean silicon surface include using aqueous solutions to oxidize the surface of the silicon. For example, an aqueous solution of ammonium hydroxide and hydrogen peroxide has been used to convert a hydrophobic hydrofluoric acid (HF) cleaned silicon surface into a hydrophilic surface.

In another example, polymeric materials have been used as materials for medical applications, such as in medical implants (e.g., artificial joints) and contact lenses. In some cases, the hydrophilic or hydrophobic character of the polymeric material (e.g., ultra-high molecular weight polyethylene (UHMWPE)) has affected biocompatibility. For example, the degradation or wear of an implant and the comfort of a contact lens have both been shown to be related to the affinity of the surface of the polymeric material for water. The modification of a hydrophobic surface to a hydrophilic one has also allowed for bonding of antibodies, ligands, or other target molecules to substrates (e.g., acrylic resins and ionic exchange materials).

Some polymers have been treated with plasmas formed using a variety of gases, such as Ar, $O_2$, $N_2$, $NH_3$, $N_2+H_2$, and $CO_2$. For example, polystyrene materials have been exposed to argon or oxygen plasmas to functionalize the surfaces. Several studies have noted that in addition to modifying the surfaces, the morphology of the polymeric material was also changed by the plasma, for example, the surfaces became rougher.

Coatings have also been used to modify polymeric materials to reduce diffusion of water and oxygen for food or electronic packaging applications. These surface modifications include sputtered, chemically deposited, or atomic layer deposited layers of inorganic oxides, such as $Al_2O_3$, $Ti_2O_3$, or $ZnO_2$. In such cases, modification of the hydrophobic polymer surface to a hydrophilic surface has been shown to improve the initiation and interface layer formation between the polymer and the inorganic coating to improve barrier properties and prevent flaking, blistering or separation.

SUMMARY

In some embodiments, the techniques described herein relate to a method including: providing a mixture including hydrogen peroxide vapor from a source, wherein a concentration of the hydrogen peroxide vapor in the mixture is substantially stable over time; forming a hydrogen peroxide plasma from the mixture; and exposing a material to the hydrogen peroxide plasma in a chamber.

BRIEF DESCRIPTION OF THE DRAWINGS

FIGS. 1B and 1C respectively show Table 1 and Table 2, which describe experimental conditions used for Examples 1-11 including hydrogen peroxide plasma, water plasma, oxygen plasma, and thermal hydrogen peroxide treatments.

FIGS. 1D and 1E respectively show Table 3 and Table 4, which describe experimental conditions used for Examples 12-15 including hydrogen peroxide plasma and oxygen plasma treatments.

DETAILED DESCRIPTION

Figure 1A:
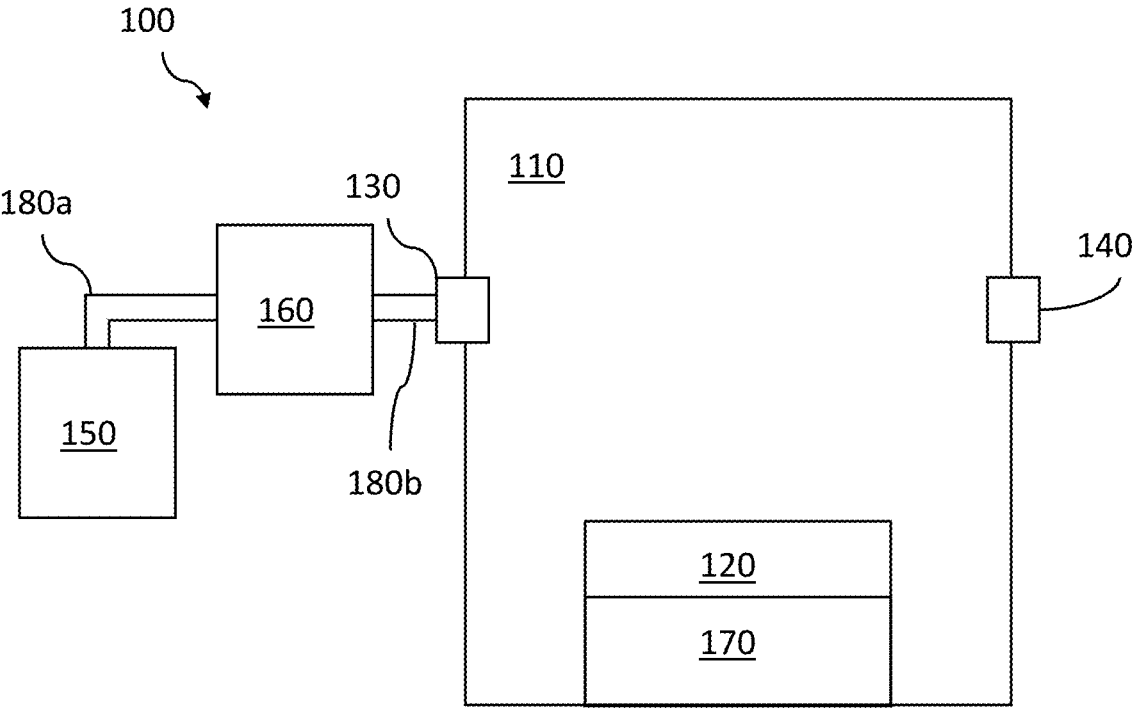
FIG. 1A shows a simplified schematic of an example of a system 100 for producing a hydrogen peroxide plasma and exposing a substrate to the produced hydrogen peroxide plasma, in accordance with some embodiments.

The present disclosure relates generally to hydrogen peroxide plasma surface modification of a material, such as a silicon (or other inorganic material) substrate or a polymeric material.

The systems and methods for hydrogen peroxide plasma surface modification of a material (e.g., a silicon substrate or polymeric material) described herein can include providing hydrogen peroxide from a hydrogen peroxide source to a plasma generation system (e.g., a remote plasma source). The hydrogen peroxide sources described herein are capable of delivering controlled and consistent quantities of hydrogen peroxide vapor, with a concentration of hydrogen peroxide vapor in a carrier gas that is substantially stable over time.

The material whose surface is modified by the hydrogen peroxide plasma can be a substrate, for example, formed from silicon or a polymeric material (e.g., plastic, resins, high-density polyethylene (HDPE), polyethylene terephthalate (PET), polyvinylidene fluoride (PVDF), polytetrafluoroethylene (PTFE), fluoropolymers, UHMWPE, polyether ether ketone (PEEK), or a polyimide). Additional examples of materials with surfaces that can be made more hydrophilic using the systems and methods described herein are any type of silicon, dielectrics, metals (e.g., such as Ru, Cu, Co), oxides (e.g., $SiO_2$, $SiCO_x$, $TiO_x$, $TaO_x$, $ZrO_x$, $HfO_x$, or HZO), or nitrides (e.g., TiN, SiN, GaN, InN, or AlN). In general, the material can be any material upon which a layer of hydroxyl groups can be formed on the surface, for example, using a hydrogen peroxide plasma.

The carrier gas, or an inert gas used to initially form the hydrogen peroxide plasma, can be many different species such as noble gases (e.g., argon, helium, neon, krypton, etc.), nitrogen, compressed dry air (CDA), or hydrogen. The hydrogen peroxide plasma can then be delivered to a chamber, wherein a material or substrate surface can be modified by forming a layer of hydroxyl groups on the surface.

The systems and methods described herein can be used in a variety of applications in which increasing the hydrophilicity of a surface, or modifying a surface (e.g., with hydroxyl groups) is needed. For example, semiconductor (e.g., Si) surfaces can be made more hydrophilic by exposure to a hydrogen peroxide plasma, which can be beneficial in microelectronics processing. In another example, polymeric materials surfaces can be modified using a hydrogen peroxide plasma, which can be beneficial in biotechnology applications. Some examples of such biotechnology applications are functionalization of surfaces (e.g., of microliter plates) for use in clinical diagnostics, environmental monitoring, pharmaceutical research and development, materials for liquid chromatography, surface modification and priming for biocompatible implants, and in many other areas of basic and applied biotechnology.

Hydrogen peroxide plasma can modify a polymer surface from hydrophobic to hydrophilic (or from less hydrophilic to more hydrophilic). Increasing hydrophilicity by conventional treatments with plasmas (e.g., composed of an oxygen or nitrogen component) has been attributed to chemical reactions between the native surface molecules of the polymer with reactive ions of the plasma gas, adding functional groups to the polymer structure. As described herein, hydrogen peroxide plasma can modify a surface of a material such that the resulting hydrophilicity of the surface can be more hydrophilic than a surface after a conventional plasma treatment. In some cases, hydroxyl functional groups can be added from the hydrogen peroxide plasma to the surface of the material, thereby increasing the hydrophilicity of the material surface.

In some embodiments, a material is exposed to a hydrogen peroxide plasma, wherein the hydrogen peroxide plasma is generated using a hydrogen peroxide vapor delivered to a plasma source using a carrier gas (e.g., argon, or other inert gas). In some embodiments, the carrier gas is substantially free of oxygen (e.g., contains less than 10%, less than 1%, less than 0.1%, less than 0.01%, or less than 0.001% oxygen by weight). In some embodiments, the hydrogen peroxide vapor delivered to the plasma source is anhydrous or substantially anhydrous (e.g., contains less than 10%, less than 1%, less than 0.1%, less than 0.01%, or less than 0.001% water by weight). In some embodiments, the hydrogen peroxide vapor delivered to the plasma source contains less than 60%, less than 50%, less than 40%, less than 30%, less than 20%, less than 10%, less than 1%, less than 0.1%, less than 0.01%, or less than 0.001% water by weight, or from 1% to 60%, or from 1% to 20%, or from 0.001% to 1% water by weight.

The carrier gas used to deliver the hydrogen peroxide to a plasma source can be many different species such as noble gases (e.g., argon, helium, neon, krypton, etc.), nitrogen, compressed dry air (CDA), or hydrogen. In some cases, using a carrier gas comprising hydrogen can beneficially prevent a surface from oxidizing while being exposed to the hydrogen peroxide plasma. Not to be limited by theory, hydrogen is a reducing agent, which can prevent a material (e.g., a substrate) from oxidizing while allowing a dense layer of hydroxyl groups to alter the hydrophilicity of the material surface. In some cases, the carrier gas comprises hydrogen and is substantially free of oxygen (as described above), for example, in order to form a layer of hydroxyls on a surface of a material from the hydrogen peroxide plasma without substantially oxidizing the surface.

The systems and methods for surface modification of a material (e.g., a substrate) using hydrogen peroxide plasma described herein do not include oxidizing the surface (or minimize the oxidation of the surface) to increase the hydrophilicity, which is advantageous since some processes require a hydrophilic surface of a material that is not oxidized (or is minimally oxidized). Thickening the oxide layer of the material can degrade performance where the hydroxylated surface is needed for forming a new film or maintaining a hydrophilic surface in the operating environment of the material.

The systems and methods for surface modification of a material (e.g., a substrate) using hydrogen peroxide plasma described herein do not include dipping the substrate into a liquid, which is advantageous since liquid processes can be more difficult to implement in some manufacturing environments than the plasma-based processes described herein. For example, in cases where the material includes pores, vias, holes, and/or deep trenches, such features can poorly wet out or have a tendency to trap gas that will prevent liquid from reaching the substrate or material interface.

In some embodiments, a method for increasing the hydrophilicity of a material includes: (a) exposing the material (e.g., a silicon substrate or polymeric material) to hydrogen peroxide plasma within a chamber; and (b) forming a hydroxyl layer on a surface of the material, wherein the hydroxyl layer increases the hydrophilicity of the material. The hydrogen peroxide plasma can be formed using a hydrogen peroxide source that provides a substantially stable concentration of hydrogen peroxide vapor over time (e.g., in a carrier gas). In some cases, a high-density layer of hydroxyl groups is thereby formed on the substrate surface. Not to be limited by theory, some surfaces can be made more hydrophilic by converting H bonds or O bonds between exposed atoms at the surface to hydroxyl bonds. For example, in the case of H-terminated silicon, H bonds or O bonds at the surface can be converted into hydroxyl bonds to form silanol groups. As the OH/H ratio increases (within limits), the silicon surface becomes more hydrophilic.

In some embodiments, an inert gas plasma is formed (e.g., using argon, helium, neon, krypton, or nitrogen), and then a hydrogen peroxide vapor is added to form a hydrogen peroxide plasma. The hydrogen peroxide vapor can be mixed with a carrier gas before being added to the plasma, and the concentration of the hydrogen peroxide vapor from the source can be substantially stable over time. The inert gas and hydrogen peroxide plasmas can be formed in a remote plasma source, and then be transferred to a chamber containing a material (or substrate, or layered structure). The hydrogen peroxide plasma can modify a surface of the material or substrate by forming a layer of hydroxyl groups on the surface of the material. In some cases, multiple surfaces of the material can be modified (e.g., made more hydrophilic) by forming a layer of hydroxyl groups on each surface. For example, the hydrogen peroxide plasma can form a layer of hydroxyl groups on a rough surface and/or a surface containing holes, pits, and/or other surface features (e.g., variations or penetrations) to modify the surface(s) (e.g., making them more hydrophilic). In some cases, a material (or substrate) has a front side and a back side, and both the front and back sides of the material (or substrate) can be modified using the hydrogen peroxide plasma. In some cases, a layer of hydroxyl groups can be formed on all exposed surfaces of the material or substrate (e.g., including holes, pits, and other surface penetrations), thereby modifying all exposed surfaces of the material or substrate (e.g., making them more hydrophilic). Therefore, the methods described herein can be used to cause exposed surfaces of a material to become more hydrophilic, even when the exposed surfaces include a rough surface, pits, and/or holes.

FIG. 1A shows a simplified schematic of an example of a system 100 for producing a hydrogen peroxide plasma and exposing a substrate to the produced hydrogen peroxide plasma. The system 100 includes a chamber 110, with a material 120 (e.g., a substrate, or a polymeric material) inside the chamber, an inlet 130 to the chamber 110 for providing the hydrogen peroxide plasma to the chamber 110, and an outlet 140 from the chamber 110 for removing species from the chamber 110. Some examples of chamber 110 are a vacuum chamber, an atomic layer deposition reactor chamber, an etch or a selective etch reactor chamber, an ashing chamber, a chemical vapor deposition chamber, a surface cleaning reactor chamber, a passivating chamber, and a photolithography process chamber. An optional heater 170 can be used to control the temperature of the material 120 (e.g., a bulk material, substrate, layered structure, etc.). A carrier gas (e.g., argon, or other inert gas) can flow through a hydrogen peroxide source 150 to provide a source of hydrogen peroxide (e.g., gaseous hydrogen peroxide, hydrogen peroxide vapor, substantially anhydrous hydrogen peroxide, or a mixed gas stream containing hydrogen peroxide) to remote plasma source 160. The plasma generated in remote plasma source 160 can then be provided to the chamber 110 through inlet 130. Excess carrier gas and other byproducts from the plasma and/or the material 120 can be removed from chamber 110 using outlet 140. The hydrogen peroxide source 150 and remote plasma source 160 can provide a controlled hydrogen peroxide plasma to material 120 within the chamber 110 for a controlled duration of time, and optionally at a controlled temperature. For example, hydrogen peroxide source 150 can provide a concentration of hydrogen peroxide vapor to remote plasma source 160 that is substantially stable over time. The system 100 can be used to perform the hydrogen peroxide plasma surface modification methods described herein (e.g., methods 1500 and 1600 in FIGS. 15 and 16).

In some cases, hydrogen peroxide source 150 is coupled to remote plasma source 160 via conduit 180a to provide a substantially stable concentration of hydrogen peroxide vapor to remote plasma source 160, and remote plasma source 160 is coupled to inlet 130 via conduit 180b to provide the hydrogen peroxide plasma to chamber 110. In some cases, the hydrogen peroxide gas can be delivered from an ampoule (or other vessel or container) within hydrogen peroxide source 150. In some cases, conduits 180a and 180b include appropriate valving and gas control apparatuses (not shown). For example, a vacuum pump (not shown) can be coupled to chamber 110 to enable a low pressure (or vacuum) environment in chamber 110, and the remote plasma source 160 (and conduit 180b) can also be held at low pressure (or vacuum). In such cases, the valves and gas control apparatuses coupled to conduits 180a and 180b can be used to control the pressure in the components of system 100. Not to be limited by theory, a hydrogen peroxide plasma can have a short lifetime at a pressure about 1 atmosphere, therefore low pressure environments within the remote plasma source, the conduit 180b, and the chamber 110 can be advantageous.

In some cases, the remote plasma source 160 can be close to or integrated with chamber 110. For example, conduit 180b can be short (e.g., less than 10 cm, or less than 1 cm) and inlet 130 can be close to the remote plasma source 160.

In some embodiments of system 100, conduit 180b can be omitted and inlet 130 can directly couple the remote plasma source 160 to chamber 110.

The hydrogen peroxide source 150 can be filled with high-quality hydrogen peroxide, for delivery to chamber 110. In some cases, the hydrogen peroxide in hydrogen peroxide source 150 is anhydrous or substantially anhydrous. In practice, it is difficult to remove all of the water from hydrogen peroxide, and in some cases, substantially anhydrous hydrogen peroxide contains less than 60%, less than 50%, less than 40%, less than 30%, less than 20%, less than 10%, less than 1%, less than 0.1%, less than 0.01%, or less than 0.001% water by weight. The mixture of the hydrogen peroxide vapor and the carrier gas can comprise less than 10%, or less than 1% of oxygen by weigh, or less than 1000 ppm, or less than 100 ppm of oxygen. In some cases, hydrogen peroxide source 150 can be filled with mixed gases and/or vapors, which can contain hydrogen peroxide and other species, such as water. In some cases, the hydrogen peroxide in hydrogen peroxide source 150 is mixed with water, wherein the amount of water in the mixture (or mixed gas) by weight is from 10 ppm to 99%, or from 100 ppm to 75%, or from 100 ppm to 35%, or from 10 ppm to 1%, or from 1% to 99%, or from 30% to 99%, or from 30% to 75%, or is less than 10%, less than 2%, less than 0.5%, less than 1000 ppm, less than 100 ppm, less than 10 ppm. In some cases, a mixture output from hydrogen peroxide source 150 can include primarily hydrogen peroxide vapor. For example, a mixture output from hydrogen peroxide source 150 can include hydrogen peroxide vapor and a small concentration (e.g., less than 10%, or less than 1%, or less than 0.1%) of water and/or oxygen. In another example, a mixture output from hydrogen peroxide source 150 can include hydrogen peroxide vapor and other components (e.g., water, or a carrier gas) at higher concentrations (e.g., up to 60%, or even higher in the case of a mixture of hydrogen peroxide vapor and a carrier gas).

The ability to deliver a controlled and consistent concentration of hydrogen peroxide vapor to form the hydrogen peroxide plasma is difficult. Additionally, it is difficult to inject a liquid into a plasma chamber (e.g., in the form of a mist or droplets) to generate a plasma. Systems and methods to deliver hydrogen peroxide, particularly those capable of delivering a controlled and consistent concentration of hydrogen peroxide vapor to form the hydrogen peroxide plasmas described herein, are further described in U.S. Pat. Nos. 8,282,708, 9,410,191, 9,545,585, 9,610,550, 10,363, 497, and 11,634,816; U.S. Pat. Pub. Nos. US20200291517A1, and US20200393086A1; U.S. application Ser. No. 18/472,551; and International Pub. Nos. WO2016/164380 and WO2017/027581, each of which is incorporated herein by reference in their entireties. Such systems and methods to deliver hydrogen peroxide can be used in the systems and methods described herein, for example, in hydrogen peroxide source 150 in FIG. 1A. Some examples of systems and methods to deliver hydrogen peroxide are described herein.

In some embodiments, the systems and methods described herein include hydrogen peroxide sources configured to provide and maintain a concentration of hydrogen peroxide vapor in the gas mixture that is substantially stable over time (or is maintained at a substantially constant value or relatively constant value over time). The concentration (or volume fraction) of the hydrogen peroxide vapor in the gas mixture can be substantially stable, for example, if the concentration is maintained to within 5%, or within 3%, or within 1% of the mean over an hour of gas mixture delivery.

The concentration (or volume) of the hydrogen peroxide vapor in the gas mixture can be substantially stable, for example, if the concentration has a standard deviation of up to 5%, or up to 3%, or up to 1% over an hour.

For example, the hydrogen peroxide source 150 in FIG. 1A can be configured to provide a substantially stable (or substantially constant) concentration of hydrogen peroxide vapor in the gas mixture over time (e.g., for about an hour), either through the use of a carrier gas or by using a vacuum to directly draw the hydrogen peroxide vapor from the hydrogen peroxide source 150. In some cases, the hydrogen peroxide vapor concentration in the gas mixture is substantially stable over time with a hydrogen peroxide concentration by volume from 500 parts per million by volume (ppmv) to 4000 ppmv, or from 100 ppmv to 100,000 ppmv, or greater than 0.1% by volume, or greater than 1%, or greater than 2.5%, or greater than 10%, or from 0.1% to 10%, or from 0.1% to 2.5%, or from 1% to 10%, or from 1% to 2.5%, or from 2.5% to 10%, or from 1% to greater than 10%.

The hydrogen peroxide source (e.g., hydrogen peroxide source 150 in FIG. 1A) used to deliver hydrogen peroxide vapor to the plasma chamber (or other system component, e.g., a storage vessel) in the systems and methods described herein can utilize a carrier gas to deliver the hydrogen peroxide vapor from the source to the plasma chamber, or can use vacuum to directly draw the hydrogen peroxide vapor from the hydrogen peroxide source. In some embodiments, the hydrogen peroxide source can include a pre-loaded carrier gas in fluid contact with the vapor phase of a multi-component liquid source (e.g., aqueous hydrogen peroxide), and/or a non-aqueous (or anhydrous) hydrogen peroxide solution having a vapor phase separated from the hydrogen peroxide solution by a membrane.

The hydrogen peroxide sources described herein are uniquely capable of providing controlled concentrations of hydrogen peroxide vapor that are substantially stable over time. According to Raoult's Law, when the vapor phase of a liquid solution is continuously swept away by a carrier gas, the more volatile component will evaporate more quickly than the less volatile component, resulting in a dynamic (or changing) concentration of the components in the liquid solution, and likewise, a dynamic (or changing) concentration of the components in a vapor produced from the liquid solution. If evaporation of the more volatile component continues, the solution will become more concentrated for the less volatile component, and in some cases (e.g., aqueous hydrogen peroxide solutions), this may take a stable solution and convert it to a highly concentrated hazardous material. The hydrogen peroxide sources of the systems and methods described herein overcome such limitations and are configured to deliver stable concentrations of a vapor of hydrogen peroxide over time, for example, by using a pre-loaded carrier gas in fluid contact with the vapor phase of a multi-component liquid source, and/or using a non-aqueous (or anhydrous) hydrogen peroxide solution having a vapor phase separated from the hydrogen peroxide solution by a membrane.

In some embodiments, the hydrogen peroxide source of the systems and methods described herein can include: (a) a multi-component liquid source (e.g., containing aqueous hydrogen peroxide, or a solution containing hydrogen peroxide and a solvent) having a vapor phase optionally separated from the liquid source by a membrane; (b) a pre-loaded carrier gas source that is in fluid contact with the vapor phase, wherein the pre-loaded carrier gas comprises a carrier gas and at least one component of the liquid source; and (c)

an apparatus for delivering a gas stream comprising at least one component of the liquid source. The membrane can be one that is permeable to hydrogen peroxide, particularly a substantially gas-impermeable membrane, e.g., a perfluorinated ion-exchange membrane, such as a NAFION® membrane. In some embodiments, the apparatus for delivering a process gas containing the gas stream is an outlet of a head space, which contains the vapor phase, connected directly or indirectly to a plasma chamber, allowing the process gas containing gas stream to flow from the head space to the plasma chamber. Methods for delivering the hydrogen peroxide from such a source can include adjusting the operating conditions, for example, the temperature and pressure of the pre-loaded carrier gas, flow rate of the carrier gas, the concentration of the liquid source, and the temperature and pressure of the liquid source, such that the hydrogen peroxide can be precisely and safely delivered as a process gas.

In some embodiments, the hydrogen peroxide source of the systems and methods described herein can include: (a) an aqueous hydrogen peroxide source and a gas phase provided by the aqueous hydrogen peroxide source, wherein the aqueous hydrogen peroxide source comprises hydrogen peroxide at an initial concentration, and wherein the gas phase comprises hydrogen peroxide and water; (b) a carrier gas in fluid contact with the gas phase, whereby a hydrogen peroxide gas stream is formed, and whereby formation of the hydrogen peroxide gas stream the concentration of hydrogen peroxide in the aqueous hydrogen peroxide source increases to a second concentration that is higher than the initial concentration; (c) a fill tube that replenishes the aqueous hydrogen peroxide source using an aqueous hydrogen peroxide solution comprising hydrogen peroxide at a third concentration that is lower than the second concentration; and (d) an apparatus that delivers the hydrogen peroxide gas stream to the material that is to be modified, wherein the delivered hydrogen peroxide gas stream comprises hydrogen peroxide at a substantially stable steady-state concentration. For example, maintaining a hydrogen peroxide vapor concentration in the gas mixture with a standard deviation of within 3% or up to 5% of the mean for an hour would be considered substantially stable (or relatively constant).

In some embodiments, the hydrogen peroxide source of the systems and methods described herein can include: (a) a non-aqueous (or anhydrous) hydrogen peroxide solution having a vapor phase separated from the hydrogen peroxide solution by a membrane; (b) a carrier gas or vacuum in fluid contact with the vapor phase; and (c) an apparatus for delivering a gas stream comprising hydrogen peroxide from the source to the plasma chamber (or other system component, e.g., a storage vessel). The membrane can be, for example, a perfluorinated ion-exchange membrane, such as a NAFION® membrane. In some embodiments, the apparatus for delivering a gas stream comprising hydrogen peroxide is an outlet of a head space, containing the vapor phase, that is connected directly or indirectly to the plasma chamber, allowing the hydrogen peroxide containing gas stream to flow from the head space to the plasma chamber. By adjusting the operating conditions of the systems and devices, for example, the temperature and pressure of the carrier gas or vacuum, the concentration of the hydrogen peroxide solution, and the temperature and pressure of the hydrogen peroxide solution, hydrogen peroxide vapor can be precisely and safely delivered in the gas mixture. In some embodiments, the amount of hydrogen peroxide in the vapor phase and delivered to the plasma chamber can be controlled by adding energy to the hydrogen peroxide solution, e.g., thermal energy, rotational energy, or ultrasonic energy. In some cases, methods for operating such a hydrogen peroxide source can include: (a) providing a non-aqueous hydrogen peroxide solution having a vapor phase separated from the hydrogen peroxide solution by a membrane; (b) contacting a carrier gas or vacuum with the vapor phase; and (c) delivering a gas stream comprising substantially anhydrous hydrogen peroxide to the plasma chamber.

The multi-component liquid solutions and/or the non-aqueous hydrogen peroxide solutions of the sources described above can be, for example, non-aqueous solutions containing alcohols, polyalcohols, phenols, lactones, amides, esters, polyesters, ethers, carboxylic acids, polycarboxylic acids, sulfonic acids, sulfinic acids, phosphonic acids, phosphinic acids, organic solvents, inorganic solvents, aromatic compounds, polyaromatic compounds, heterocyclic compounds, including polyheterocyclic compounds, fluorinated ethers, fluorinated alcohols, fluorinated sulfonic acids, fluorinated carboxylic acids, polycarboxylic acids, fluorinated phosphonic acids, deep eutectic solvents, such as those disclosed in U.S. Pat. No. 3,557,009 and herein incorporated by reference, and combinations thereof that do not contain substantial amounts of water. Examples of solvents for such multi-component liquid solutions and/or non-aqueous hydrogen peroxide solutions include diethyl phthalate, propylene carbonate, triethylphosphate, polyvinylpyrrolidone, polyvinylalcohol, polyvinylacetate-polyvinylpyrrolidone co-polymer, mellitic acid, benzenehexol, tetrahydrobenzoquinone, 1,8-octanediol, 2,6-dichlorophenol, acridine, 8-hydroxyquinoline, benzylic acid, 1,4-dioxane, amyl acetate, DMF, DMSO, dimethylacetamide, 2-ethyl-1-hexanol, furfuryl alcohol, 2-octanol, 2-methyl-2-heptanol, and combinations thereof.

In some embodiments, the hydrogen peroxide source of the systems and methods described herein can include a storage device for a process solution containing hydrogen peroxide. The storage device can include: a housing with a wick material disposed therein; a process solution contained within the housing and in fluid contact with the wick material such that the solution is adsorbed onto the wick material, thereby diluting the solution within the wick material; and a head space contained within the housing and separated from the process solution by the wick material. The process solution contains hydrogen peroxide, and optionally one or more other components (e.g., water, solvent, or any of the liquids described herein). In some cases, the process solution contains anhydrous hydrogen peroxide. In various embodiments, the housing is configured to allow a carrier gas to flow through the head space or is configured to allow a vacuum to be drawn through the head space to produce a gas stream comprising a gas phase of the process solution to deliver the gas stream to the plasma chamber (or other system component, e.g., a storage vessel). In some embodiments, the quantity of the process solution in the device is about 30% to 1900% by weight of the process solution/wick material complex, or is about 30% to 800% by weight of the process solution/wick material complex, or is about 30% to 100% by weight of the process solution/wick material complex.

In some embodiments, the wick material of the devices described above is a porous structure with a surface area ranging from 100 to 1000 $m^2/g$. In various embodiments, the wick material is configured to adsorb over 42% by mass (or "w/w") hydrogen peroxide, or to absorb over 50% w/w hydrogen peroxide, or over 100% w/w, or over 200% w/w, or over 800% w/w, or over 1000% w/w, or over 1900% w/w hydrogen peroxide. In some embodiments, the concentration of the hydrogen peroxide solution is below 30% w/w. In some embodiments, the concentration of the hydrogen peroxide solution is stable over time, such as over a period of time that is no less than approximately 1 hour, or no less than 100 hours. In some embodiments, the concentration of the hydrogen peroxide vapor output from the device is stable over time, for example, approximately 1 hour.

In some embodiments, the wick material is formed as a fabric, a powder, one or more bricks, one or more blocks, one or more beads, one or more particles, one or more extrudates, or one or more pellets. In some embodiments, the wick material is a non-woven fabric that has been treated with a mechanical finishing process, such as spun bonding, needle bonding, perforation bonding, carding, and any combination thereof. In some embodiments, the non-woven fabric is a polytetrafluoroethylene (PTFE) fabric. In some embodiments, the wick material is formed as a mesh. In some embodiments, the wick material is formed from a material such as alumina, aluminum oxide, titanium dioxide, silica, silicon dioxide, quartz, activated carbon, carbon molecular sieve, carbon pyrolyzate, polytetrafluoroethylene (PTFE), polyester (PE), polyethylene terephthalate (PET), polyethylene/polyethylene terephthalate co-polymer, polypropylene (PP), rayon, zirconium oxide, zeolite, high silica zeolite, polymethylpentene (PMP), polybutylene terephthalate (PBT), polyethylene/polypropylene co-polymers, Hydrophilic High Density Polyethylene (HDPE), Hydrophobic High Density Polyethylene (HDPE), Hydrophilic UHMW Polyethylene, Hydrophobic UHMW Polyethylene, perfluoroalkoxy alkane (PFA), polyvinylidene fluoride (PVF), silk, tencel, sponge materials, polyethylene glycol (PEG), polyvinyl alcohol (PVA), and/or polyvinylpyrrolidone (PVP), polypyridine, polyacrylates, polyacrylic acid, polyacrylic acid/acrylate co-polymers, polycarbonates, polyacrylamides, polyacrylate/acrylamide co-polymers, cellulosic materials, and any combination thereof. In some embodiments, the mesh substrate is spiral-wound within the housing.

In some embodiments, the above storage device includes a separator disposed adjacent to the mesh, wherein the separator is configured to support and separate layers of the spiral-wound mesh. In certain embodiments, the separator is formed from PTFE.

In some embodiments, the wick material is a hydrogel selected from the group consisting of polyethylene glycol (PEG), polyvinyl alcohol (PVA), polyvinylpyrrolidone (PVP), polypyridine, and any combination thereof. In various embodiments, the hydrogel is a 20% PEG hydrogel or a 40% PEG hydrogel. In some embodiments, the hydrogel is wrapped in a PTFE mesh and/or may further include a separator disposed adjacent to the mesh.

In some embodiments, a method for delivering the hydrogen peroxide vapor using the hydrogen peroxide sources described herein includes contacting the process solution containing hydrogen peroxide with the wick material within the enclosed housing such that the solution is adsorbed onto the wick material, thereby diluting the process solution within the wick material; exposing the wick material to a carrier gas or a vacuum, thereby forming a gas stream comprising a gas phase of the process solution; and delivering the gas stream to a plasma chamber (or other component of the system). The housing may be configured to allow the carrier gas to flow through a head space contained within the housing or is configured to allow vacuum to be drawn through the head space, and the head space may be separated from the process solution by the wick material.

In some embodiments a hydrogen peroxide vapor delivery system includes the process solution provided within the housing, wherein the process solution is in contact with a wick material disposed within the housing such that the solution is adsorbed onto the wick material, thereby diluting the process solution within the wick material. The chemical delivery system may also include a carrier gas or vacuum in fluid contact with the gas phase in the head space of the process solution, thereby forming a transportable gas stream within the head space. The chemical delivery system may further include an apparatus in fluid communication with the housing and used for delivering the gas stream to a plasma chamber (or other component of the system). In some embodiments, the housing allows the carrier gas to flow through a head space contained within the housing or allows vacuum to be drawn through the head space.

The hydrogen peroxide source methods and systems described herein, including the process solution and the wick material, may further comprise use of various components for containing and controlling the flow of the gases and liquids used therein. For example, the methods and systems may include one or more mass flow controllers, valves, check valves, filters, pressure gauges, gas sensors, regulators, rotameters, and pumps. The methods and systems provided herein may also include various heaters, thermocouples, and temperature controllers to control the temperature of various components of the systems and steps of the methods.

In some embodiments, the systems and methods described herein include hydrogen peroxide sources (such as those described above) configured to provide and maintain a molar ratio of water to hydrogen peroxide that is substantially stable over time (or is maintained at a substantially or relatively constant value over time). The molar ratio of water to hydrogen peroxide that is substantially stable over time in the gas mixture can be substantially stable, for example, if the molar ratio (or the concentration of the hydrogen peroxide and the concentration of the water) is maintained to within 1%, or within 3%, or within 5% of the mean for an hour of gas mixture delivery. The molar ratio of water to hydrogen peroxide that is substantially stable over time in the gas mixture can be substantially stable, for example, if the molar ratio has a standard deviation of 1%, or 3%, or up to 5% over an hour. For example, the hydrogen peroxide source 150 in FIG. 1A can be configured to provide a substantially constant concentration of hydrogen peroxide vapor and water in the gas mixture, either through the use of a carrier gas or by using a vacuum to directly draw the hydrogen peroxide vapor from the hydrogen peroxide source 150. The hydrogen peroxide vapor and water concentrations can be any of those described herein.

The conditions within chamber 110 during the exposure of a material 120 (e.g., a substrate, or polymeric material) to hydrogen peroxide plasma can affect the degree to which the hydrophilicity of the surface of the material (e.g., bulk material, substrate, or layered structure) is increased. In some cases, the pressure within the chamber can be from 1 mTorr to 1000 Torr, from 0.1 Torr to 10 Torr, or about 0.5 Torr, or about 5 Torr. The flow rate of gas into remote plasma source 160 (or the flow rate of gas into chamber 110, or the flow rate of a carrier gas through hydrogen peroxide source 150) can be from 10 sccm to 200 Lpm, or from 10 sccm to 10 Lpm, or from 10 sccm to 1 Lpm, or from 500 sccm to 5000 sccm. The flow rate of gas (e.g., hydrogen peroxide vapor) can be substantially stable over time, and the variability in the flow rate over time can also be small (e.g., with a standard deviation of up to 5%, or up to 3%, or up to 1% over the process time). The process time, or the duration of the exposure of the material 120, can be from 1 min to 10 min, or from 10 sec to 100 min. The temperature of the material 120 can be from 20° C. to 300° C., or from 100° C. to 300° C., or from 150° C. to 200° C., or from 20° C. to 150° C., depending in part on the melting point or glass transition temperature of the material 120).

System 100 or similar systems can be used for any of the methods or processes described herein. For example, a water plasma can be generated using the remote plasma source 160 instead of a hydrogen peroxide plasma. In such cases, hydrogen peroxide source 150 can be replaced with a water source. In another example, an oxygen plasma can be generated using the remote plasma source 160 instead of a hydrogen peroxide plasma. In such cases, hydrogen peroxide source 150 can be omitted, and an oxygen gas can be provided directly to remote plasma source 160. In another example, material 120 can be exposed to a thermal hydrogen peroxide treatment instead of a hydrogen peroxide plasma. In such cases, remote plasma source 160 can be omitted, and hydrogen peroxide vapor can be provided to chamber 110 directly from hydrogen peroxide source 150.

EXAMPLES

Hydrogen peroxide plasmas were used to treat several kinds of materials including semiconductor substrates and polymeric materials, and the results compared with those from other types of treatments. FIGS. 1B and 1C respectively show Table 1 and Table 2, which describe experimental conditions used for Examples 1-11 including hydrogen peroxide plasma, water plasma, oxygen plasma, and thermal hydrogen peroxide treatments. FIGS. 1D and 1E respectively show Table 3 and Table 4, which describe experimental conditions used for Examples 12-15 including hydrogen peroxide plasma and oxygen plasma treatments.

Table 1 shows examples of hydrogen peroxide plasma generation using a system similar to that shown in FIG. 1A. The method for Tests A-D included generating an argon plasma with an initial flow of argon (at a 500 sccm flow rate). Subsequently, the carrier gas listed in Table 1 was directed through the hydrogen peroxide source (e.g., hydrogen peroxide source 150 in FIG. 1A) to introduce a substantially stable concentration of hydrogen peroxide vapor and carrier gas to the plasma. The final pressure of the hydrogen peroxide plasma with the carrier gas was approximately 5 Torr for all conditions in Table 1. The hydrogen peroxide used in Tests A-D was substantial anhydrous, as described herein. Tests A and B resulted in stable hydrogen peroxide ignition, while Tests C and D did not. The total carrier gas flow rate was kept constant for these tests at 5000 sccm. These tests show that a stable hydrogen peroxide plasma can be generated using argon carrier gas, and that some oxygen can be added to the argon carrier gas. However, oxygen carrier gas, or a mixture of argon and oxygen with too much oxygen did not result in a stable plasma in Tests C and D.

Table 2 shows experimental conditions for Examples 1-11, wherein hydrogen peroxide plasma, water plasma, oxygen plasma, or a thermal hydrogen peroxide treatment were used to modify the surface of a material, which was a silicon substrate in these Examples. Examples 1-8 used a hydrogen peroxide plasma (Examples 1-5) or water plasma (Examples 6-8) with different carrier gases to modify the silicon surface using a system similar to that shown in FIG. 1A with hydrogen peroxide source 150. Example 9 used an oxygen plasma using a system similar to that shown in FIG.

1A (with the hydrogen peroxide source 150 omitted). Examples 10-11 used a thermal hydrogen peroxide treatment to modify the silicon surface, wherein the silicon substrate was exposed to hydrogen peroxide vapor (not a hydrogen peroxide plasma) at elevated temperatures using a system similar to that shown in FIG. 1A (with the remote plasma source 160 omitted). The temperatures of the silicon substrate for Examples 1-11 are shown in Table 2, and the duration of the exposure to the treatments was 5 minutes in each of these Examples.

Figure 2A:
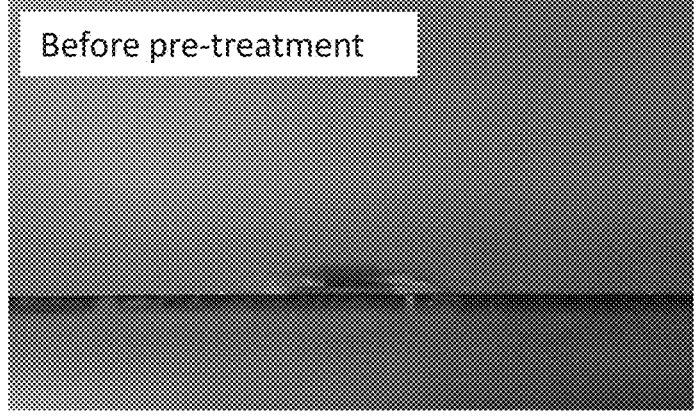
FIGS. 2A and 2B show water contact angle (WCA) measurements of silicon surfaces before and after pretreatment, in accordance with some embodiments.
Figure 2B:
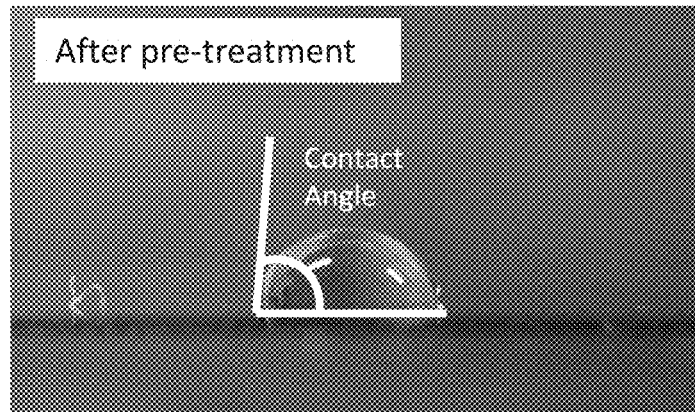

The degree of surface modification of the silicon substrates in Examples 1-11 was evaluated using static water contact angle (WCA) measurements. In static WCA measurements, higher contact angles indicate more hydrophobic surfaces, and smaller contact angles indicate more hydrophilic surfaces. For example, FIGS. 2A and 2B show static WCA measurements of silicon surfaces before and after pre-treatment, and the contact angle of a water droplet on the surface is labeled in FIG. 2B. Additionally, FIGS. 3A-3B, 4A-4B, 5A-5B, 6-8, and 9A-9B show static WCA measurements of silicon surfaces from Examples 1-11, and some static WCA measurements (after the exposure to the hydrogen peroxide plasma or thermal treatment, i.e., the "Resulting contact angle") are shown in Table 2. All contact angle measurements and contact angles described herein are "static water contact angle (WCA) measurements" and "static water contact angles (WCAs)," and they may be referred to as "WCA measurements," "contact angle measurements," or "contact angles." All contact angle measurements described herein refer to static contact angle measurements.

In Examples 1-11, the silicon surfaces were pretreated to substantially remove their native oxide layers before the silicon substrate was exposed to the treatment conditions in Examples 1-11 (e.g., hydrogen peroxide plasma or hydrogen peroxide vapor). The pre-treatment included dipping the silicon substrates in a buffered HF etchant for 30 seconds. FIG. 2A shows WCA measurements before the dipping, and FIG. 2B shows the WCA measurement after the native oxide was removed. Before the pre-treatment, the silicon surface is relatively hydrophilic due to the presence of the native oxide, as indicated by the small WCA measured in FIG. 2A. After the pre-treatment the contact angle is nearly 90° (about 85° in the examples shown in FIG. 2B) indicating a substantially hydrophobic surface of the bare silicon without a significant native oxide (e.g., with a substantially hydrogen-terminated surface). All of the treatment conditions in Examples 1-11 were performed on pre-treated silicon substrates similar to that shown in FIG. 2B, and therefore the resulting contact angles in the Examples can be compared to the initial (or control) contact angle shown in FIG. 2B.

Figure 3A:
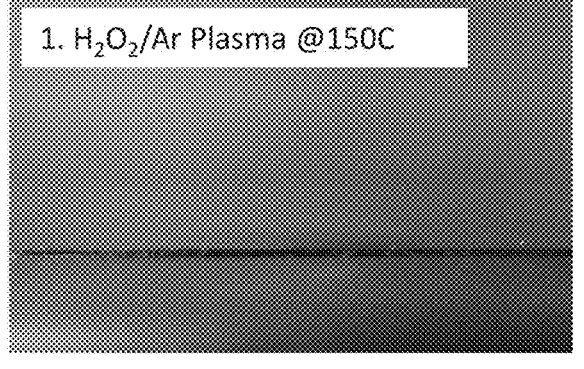
FIGS. 3A-3B, 4A-4B, 5A-5B, 6-8, and 9A-9B show static WCA measurements of silicon surfaces from Examples 1-11, in accordance with some embodiments.
Figure 3B:
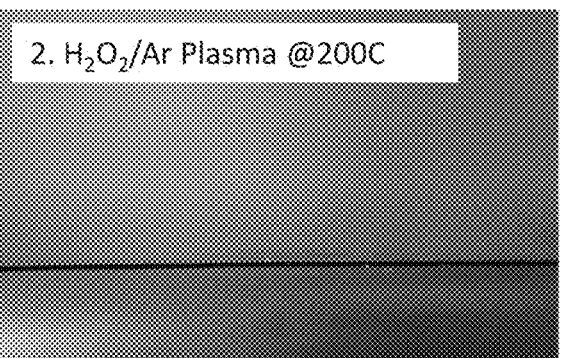

FIGS. 3A and 3B show WCA measurements from Examples 1 and 2, wherein the silicon substrate surface was modified using hydrogen peroxide plasma with an argon carrier gas at a substrate temperature of 150° C. and 200° C. respectively. The contact angle for the silicon substrate is small in both of these examples, and showed that the hydrogen peroxide plasma with argon carrier gas in these examples effectively modified the silicon substrate surface to be substantially hydrophilic as evidenced by the relatively flat layer of water across the surface of the substrate. The contact angle of the silicon substrate after exposure to the hydrogen peroxide plasma in Example 2 (at 200° C. substrate temperature) was about 4.0°, which was significantly more hydrophilic than the bare silicon substrate (which was substantially hydrophobic and had a contact angle of about 85° as shown in FIG. 2B).

Figure 4A:
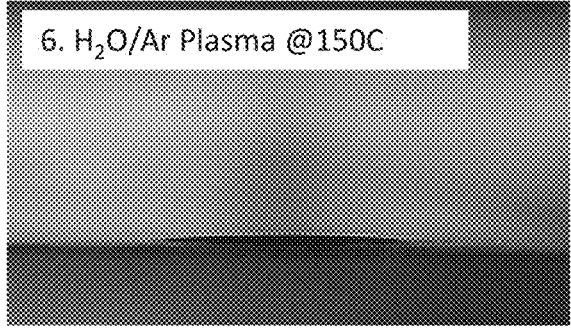
Figure 4B:
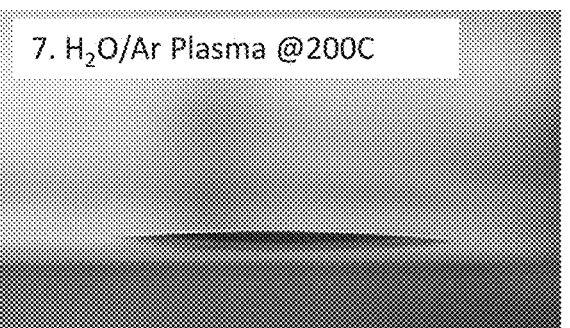

FIGS. 4A and 4B show WCA measurements from Examples 6 and 7, wherein the silicon substrate surface was modified using water plasma with an argon carrier gas at a substrate temperature of 150° C. and 200° C. respectively. The contact angle for the silicon substrate is also relatively small in both of these examples, and showed that the water with argon carrier gas in these examples also modified the silicon substrate surface to be more hydrophilic than the bare silicon substrate. However, the contact angles for Examples 6 and 7 using water plasma were larger than those of the substrates in Examples 1 and 2 where a hydrogen peroxide plasma was used. The contact angle of the silicon substrate after exposure to the water in Example 7 (at 200° C. substrate temperature) was about 6.5°, which was larger than the contact angle of the silicon substrate after exposure to the hydrogen peroxide plasma in Example 4 (at 200° C. substrate temperature), which was about 4.0°. Even though the contact angle of the silicon substrate after exposure to the water in Example 7 was significantly more hydrophilic than the bare silicon substrate (which was substantially hydrophobic and had a contact angle of about 85° as shown in FIG. 2B), the water plasma still did not perform as well as the hydrogen peroxide plasma. This is consistent with the concentration of hydroxide species being higher in the hydrogen peroxide plasma than the water plasma (e.g., as shown in the spectra FIG. 10 and described in more detail below).

Figure 5A:
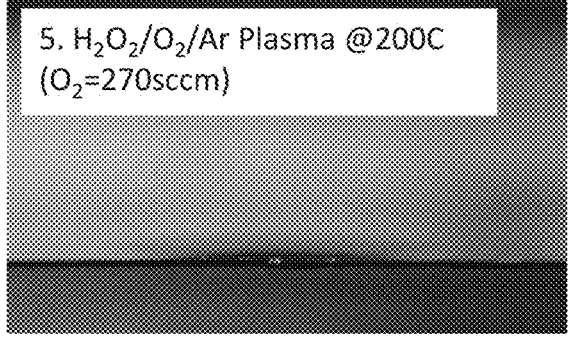
Figure 5B:
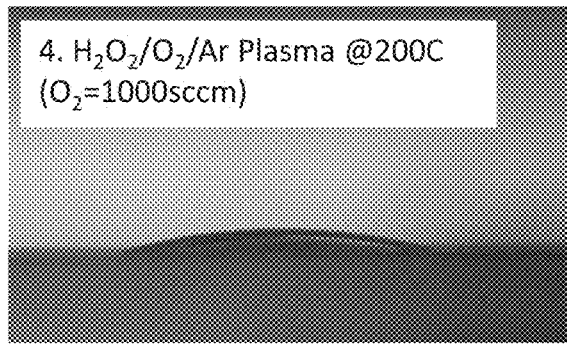

FIGS. 5A and 5B show WCA measurements from Examples 5 and 4, respectively, wherein the silicon substrate surface was modified using hydrogen peroxide plasma with a mixed argon and oxygen carrier gas at a substrate temperature of 200° C. Example 5 used a carrier gas containing 270 sccm of oxygen mixed with argon and Example 4 used a carrier gas containing 1000 sccm of oxygen mixed with argon. Even though the resulting contact angles in Examples 4 and 5 were significantly lower than the pretreated silicon substrate (which was substantially hydrophobic and had a contact angle of about 85° as shown in FIG. 2B), adding oxygen to the hydrogen peroxide plasma resulted in less hydrophilic silicon surfaces compared to Examples 1 and 2. These examples showed that the contact angle increased as more oxygen was added to the carrier gas and that the presence of oxygen in the hydrogen peroxide plasma resulted in a less hydrophilic surface compared to similar Example 2 using argon carrier gas without oxygen.

Figure 6:
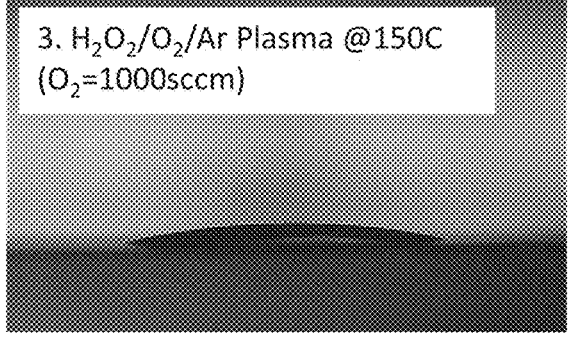

FIG. 6 shows a WCA measurement from Example 3, wherein the silicon substrate surface was modified using hydrogen peroxide plasma with a mixed argon and oxygen carrier gas at a substrate temperature of 150° C. Example 3 used a carrier gas containing 1000 sccm of oxygen mixed with argon. Similar to Examples 4 and 5, this example showed that the contact angle increased as oxygen was added to the carrier gas, and that the presence of oxygen in the hydrogen peroxide plasma resulted in a less hydrophilic surface compared to conditions using argon carrier gas without oxygen, even at the lower temperature of 150° C.

Figure 7:
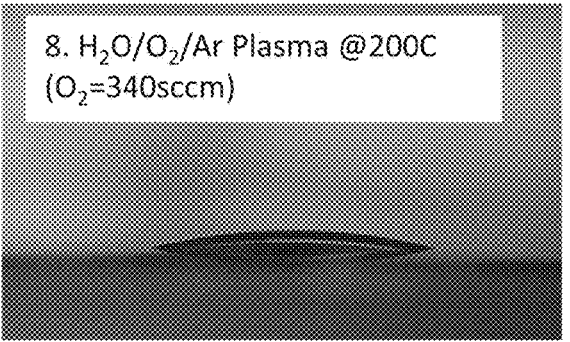

FIG. 7 shows a WCA measurement from Example 8, wherein the silicon substrate surface was modified using a water plasma with a mixed argon and oxygen carrier gas at a substrate temperature of 200° C. Example 8 used a carrier gas containing 340 sccm of oxygen mixed with argon. Even though the resulting contact angle in Example 8 was significantly lower than the pretreated silicon substrate (which was substantially hydrophobic and had a contact angle of about 85° as shown in FIG. 2B), this example showed that the contact angle increased as oxygen was added to the carrier gas of a water plasma. Similar to the examples using hydrogen peroxide plasmas, these examples showed that the presence of oxygen in the water plasma resulted in a less hydrophilic surface than when the water plasma with the argon carrier gas was used without mixing with oxygen (e.g., as shown by the smaller resulting contact angle in Example 7).

Figure 8:
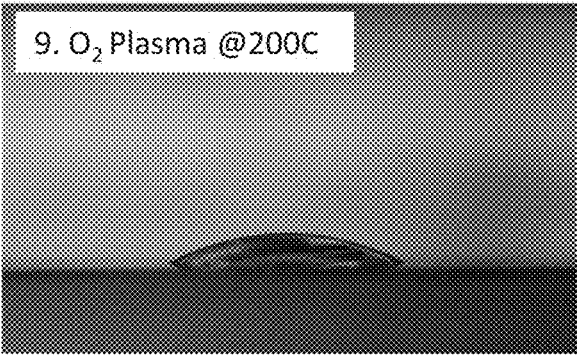

FIG. 8 shows a WCA measurement from Example 9, wherein the silicon substrate surface was modified using a mixed oxygen and argon plasma at a substrate temperature of 200° C. This example showed that the silicon surface was modified by the oxygen plasma to be more hydrophilic than the pretreated silicon substrate (which was substantially hydrophobic and had a contact angle of about 85° as shown in FIG. 2B). However, the oxygen plasma in this example resulted in a less hydrophilic surface than when the silicon surface was modified using a hydrogen peroxide plasma with an argon carrier gas (e.g., as shown by the smaller resulting contact angle in Example 2).

Figure 9A:
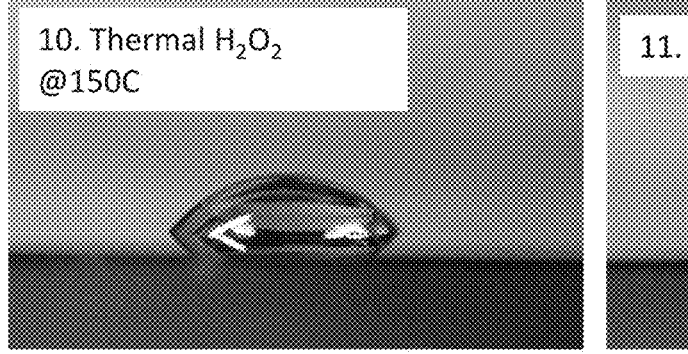
Figure 9B:
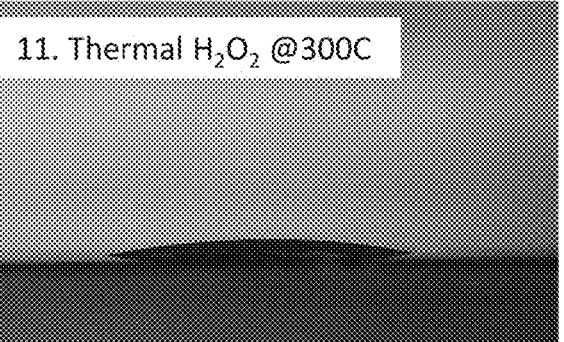

FIGS. 9A and 9B show WCA measurements from Examples 10 and 11, wherein the silicon substrate surface was modified by exposing the substrate to a gas stream containing hydrogen peroxide vapor in a carrier gas at a substrate temperature of 150° C. and 200° C. respectively. These examples showed that the silicon surface was modified by the thermal hydrogen peroxide treatment to be more hydrophilic than the pretreated silicon substrate (which was substantially hydrophobic and had a contact angle of about 85° as shown in FIG. 2B). Additionally, the thermal hydrogen peroxide treatment at 200° C. (Example 11) resulted in a significantly more hydrophilic silicon surface than the thermal hydrogen peroxide treatment at 150° C. (Example 10). However, the resulting contact angle after the thermal hydrogen peroxide treatment in Example 11 was 11.5°, which was significantly higher than the resulting contact angle of 4.0° observed after the hydrogen peroxide plasma exposure in Example 2. Additionally, the substrate temperature was 300° C. in Example 11 (thermal hydrogen peroxide) and only 200° C. in Example 2 (hydrogen peroxide plasma). Therefore, the thermal hydrogen peroxide treatments in these examples resulted in less hydrophilic surfaces than when the silicon surface was modified using a hydrogen peroxide plasma with an argon carrier gas (e.g., as shown by the smaller resulting contact angles in Examples 1 and 2).

To summarize the results of Examples 1-11, all of the conditions resulted in a surface modification of the silicon substrates to be more hydrophilic than the pretreated silicon substrate. The most hydrophilic silicon surfaces in Examples 1-11 were produced using the hydrogen peroxide plasmas with argon carrier gas at substrate temperatures of 150° C. and 200° C. (Examples 1 and 2). Water plasmas with argon carrier gas (Examples 6 and 7) resulted in higher contact angles (less hydrophilic surfaces) than when hydrogen peroxide plasmas with argon carrier gas were used (Examples 1 and 2). Adding oxygen to the carrier gas of the hydrogen peroxide plasmas (Examples 3, 4 and 5) also resulted in higher contact angles (less hydrophilic surfaces) than when hydrogen peroxide plasmas with argon carrier gas but without oxygen were used (Examples 1 and 2). Adding oxygen to the water plasmas also increased the resulting contact angles (Example 8 compared to Examples 6 and 7). Thermal hydrogen peroxide treatments at substrate temperatures of 150° C. and 200° C. (Examples 10 and 11) also resulted in higher contact angles (less hydrophilic surfaces) than when hydrogen peroxide plasmas with argon carrier gas were used (Examples 1 and 2), with the 200° C. condition (Example 11) resulting in a significantly more hydrophilic surface than the 150° C. condition (Example 10).

Figure 10:
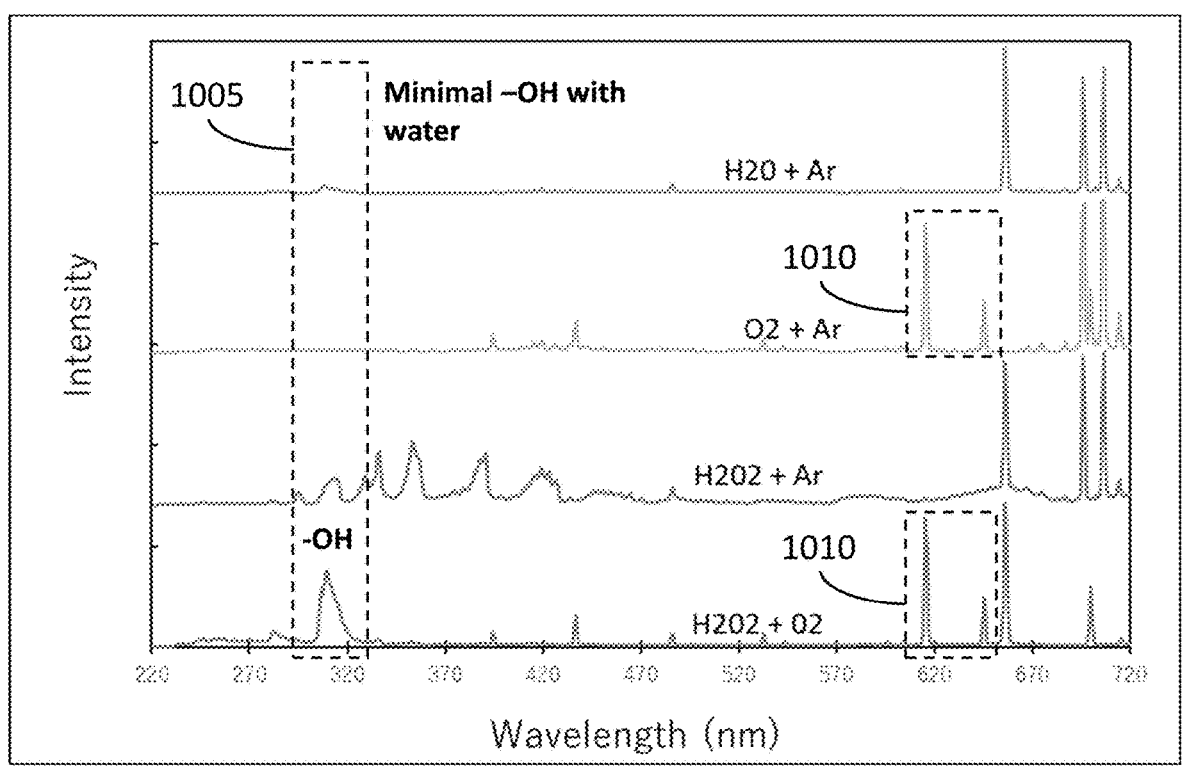
FIG. 10 shows spectra of the plasmas used in Examples 1-9, obtained using optical emission spectroscopy, in accordance with some embodiments.

FIG. 10 shows spectra of the plasmas used in Examples 1-9, obtained using optical emission spectroscopy. The hydroxyl peak is shown at approximately 309 nm. These spectra showed that the hydroxyl peak was present in the water plasma (i.e., "H2O+Ar"), and in the hydrogen peroxide plasma generated using the argon carrier gas (i.e., "H2O2+Ar") and the mixed argon and oxygen carrier gas (i.e., "H2O2 O2+Ar"). No significant hydroxyl peak was observed in the mixed oxygen and argon plasma (i.e., "O2+Ar").

The spectra shown in FIG. 10 showed that there was more hydroxyl content in the hydrogen peroxide plasma generated with the argon carrier gas than the water plasma generated with the argon carrier gas. Not to be limited by theory, this may be because the bond dissociation energy to form-OH is higher for water (5.17 eV) than it is for hydrogen peroxide (2.22 eV), causing the hydroxyl content in the water plasma to be lower than that of the hydrogen peroxide plasma. The resulting contact angles were also lower (more hydrophilic) after exposure to the hydrogen peroxide plasmas than after exposure to the water plasmas (both using argon carrier gas). Not to be limited by theory, this is consistent with a layer of hydroxide groups formed on the surface of the substrate increasing the hydrophilicity of the substrate.

The spectra shown in FIG. 10 also showed that there was more hydroxyl content in the hydrogen peroxide plasma generated with the mixed argon and oxygen carrier gas than in the hydrogen peroxide plasma generated with the argon carrier gas alone. Surprisingly, a more hydrophilic surface was produced using the hydrogen peroxide plasma generated with the argon carrier gas (Examples 1 and 2) than when the hydrogen peroxide plasmas generated with the mixed argon and oxygen carrier gas were used (Examples 3, 4 and 5). This result was not easily predictable, and therefore was a counter-intuitive phenomenon discovered through the careful experimentation described above.

Not to be limited by theory, from the spectra, it appears that oxygen in a plasma creates an oxygen radical peak (e.g., in peaks 1010) that is not seen with water or hydrogen peroxide without substantial amounts of oxygen present (e.g., with an argon carrier gas). Oxygen radicals can penetrate into silicon and create a thicker oxide layer. Oxygen radicals can also convert the silicon atoms at the surface from two hydroxyls to a single bridged oxygen atom when $SiO_2$ is formed. $SiO_2$ is less hydrophilic by the removal of surface hydroxyls and conversion to a single oxygen atom. Additionally, similar mechanisms can occur in other types of materials, for example, other inorganic or organic materials. For example, an organic material can oxidize by forming a bond between a carbon and an oxygen atom (e.g., supplied from excited oxygen species in a plasma), or the organic material can hydroxylate by forming a bond between a carbon atom and a hydroxyl group (e.g., supplied from excited hydroxyl species in the plasma). In general, a surface can be hydroxylated when hydroxyl groups are attached to the surface by any means, for example, by forming covalent bonds to atoms, or by being physisorbed or chemisorbed onto the surface. Oxygen plasma can also damage organic surfaces by converting hydrocarbons to $CO_2$ (or $CO_2$ gas) which is volatile and leaves the surface. This can lead to pitting, increase surface roughness, and/or change in the overall morphology of the material.

For purposes where higher hydroxyl density is needed (e.g., for bonding to hydroxyl, or for decreased surface energy), the addition of oxygen to the plasma can reduce the overall hydroxyl density by overcoming the hydroxyls that can be formed on the surface. Therefore, for higher hydroxyl density, water vapor or hydrogen peroxide plasma without oxygen can be used. Furthermore, hydrogen peroxide plasma can be used to produce surfaces with a higher hydroxyl density than water plasmas, as evidenced by the larger hydroxyl peak 1005 in the optical emission spectroscopy study in FIG. 10, and resulted in the most hydrophilic surfaces in the experimental results (Examples 1 and 2). The present systems and methods uniquely use hydrogen peroxide plasmas (e.g., with low oxygen content) to increase the hydrophilicity of a surface by forming a hydroxylated surface, and are able to do so without causing significant oxidation of and subsurface damage to the material. In some cases, exposing the material to the hydrogen peroxide plasma (e.g., with a low oxygen content), as described herein, does not substantially increase a roughness of the surface.

The experimentally obtained spectra shown in FIG. 10 with oxygen in the plasmas (i.e., "O2+Ar" and "H2O2+O2") include peaks 1010 that were not observed in the spectra from plasmas without oxygen (i.e., "H2O+Ar" and "H2O2+ Ar"). Not to be limited by theory, the spectra in FIG. 10 appear to show that oxygen in a plasma created an oxygen radical peak (e.g., in peaks 1010) that was not seen in the plasmas with water or hydrogen peroxide mixed with argon only. Oxygen radicals when attaching to the surface of silicon can not only penetrate the surface and create a relatively thick oxide layer, but can also convert the silicon surface from two hydroxyls to a single bridged oxygen atom (to form $SiO_2$ and/or siloxane (i.e., Si—O)). The resulting $SiO_2$ and/or siloxane surface is made less hydrophilic by the removal of surface hydroxyls and conversion to a single oxygen atom. Surfaces with high hydroxyl densities can advantageously decrease the surface energy and make the surface more hydrophilic, however, in the Examples described herein the addition of oxygen to the plasma appeared to disadvantageously reduce the hydroxyl density thereby making the surfaces more hydrophobic. Not to be limited by theory, this may have occurred because molecular oxygen generated radicals added to the water or hydrogen peroxide plasma overcame the hydroxyls provided by either water vapor or hydrogen peroxide gas to form $SiO_2$ and/or siloxane at the surface, thereby reducing the overall surface hydroxyl density and disadvantageously increasing the surface energy. Not to be limited by theory, similar reactions may occur at the surfaces of other materials, such as polymeric materials, and oxygen radicals in a plasma can bond with surface atoms and displace hydroxyl groups at the surface causing the surface to become less hydrophilic. Not to be limited by theory, additionally, higher hydroxyl concentration on the surface can create a greater surface area for the absorption of water molecules. This can cause the surface to be more hydrophilic, since the more water molecules attached to the surface, the higher the hydrophilicity.

Examples 12-15 included plasma treatments of polymeric materials. Table 3 shows the experimental parameters for Examples 12-15, in which four types of polymer substrates were each exposed to three different plasma conditions, to determine the effects on the surface hydrophilicity. In these Examples, HDPE, PET, PVDF and PTFE were each exposed to three different plasmas ($O_2$, $H_2O_2/N_2$ and $H_2O_2/O_2$ plasmas) with four different pressure and power combinations, for a total of 12 experimental conditions for each type of polymeric materials. The static water contact angle (WCA) results from Examples 12-15 are shown in FIGS. 11A-14C, as noted in Table 3.

Table 4 shows the pressure and power conditions for each of the Examples 12-15. In Example 12, HDPE substrates were exposed to oxygen plasma with low-high conditions for pressure and power respectively (i.e., LH, a pressure of 200 mTorr and a power of 100 watts), high-high conditions for pressure and power respectively (i.e., HH, a pressure of 375 mTorr and a power of 100 watts), low-low conditions for pressure and power respectively (i.e., LL, a pressure of 200 mTorr and a power of 50 watts), and high-low conditions for pressure and power respectively (i.e., HL, a pressure of 375 mTorr and a power of 50 watts). In Example 12, HDPE substrates were also exposed to a $H_2O_2/N_2$ plasma at the LH, HH, LL and HL conditions. In Example 12, HDPE substrates were also exposed to a $H_2O_2/O_2$ plasma at the LH, HH, LL and HL conditions. In Example 13, PET substrates were exposed to the same types of plasmas at the same pressure and power combinations as Example 12. In Example 14, PVDF substrates were exposed to the same types of plasmas at the same pressure and power combinations. In Example 15, PTFE substrates were exposed to the same types of plasmas at the same pressure and power combinations.

In Examples 12-15, coupons of approximately 1"×1" of the four polymers, HDPE, PET, PVDF, and PTFE, were first cleaned with isopropyl alcohol, rinsed with deionized (DI) water, and dried in a vacuum oven at 40° C. for at least one hour. The coupons were then loaded into a plasma chamber configured to expose the coupons to an $O_2$, $H_2O_2/N_2$ or $H_2O_2/O_2$ plasma, and treated for a duration of 5 minutes according to the power and pressure settings in Table 4. A system similar to system 100 in FIG. 1A was used for Examples 12-15, where the hydrogen peroxide was delivered from a hydrogen peroxide source 150, a hydrogen peroxide plasma was formed in a remote plasma source 160, and the hydrogen peroxide plasma was introduced into chamber 110 where material 120 was exposed to the hydrogen peroxide plasma. The oxygen and nitrogen were supplied as gases. The $O_2$ plasmas were produced by bypassing the hydrogen peroxide source 150. The hydrogen peroxide gas was generated from a hydrogen peroxide source (e.g., 150 in FIG. 1A), using the systems and methods described herein. The hydrogen peroxide concentration in the gas output from the source was substantially stable over time at about 2250 ppm, and the water content of the gas was about 1130 ppm.

Figure 11A:
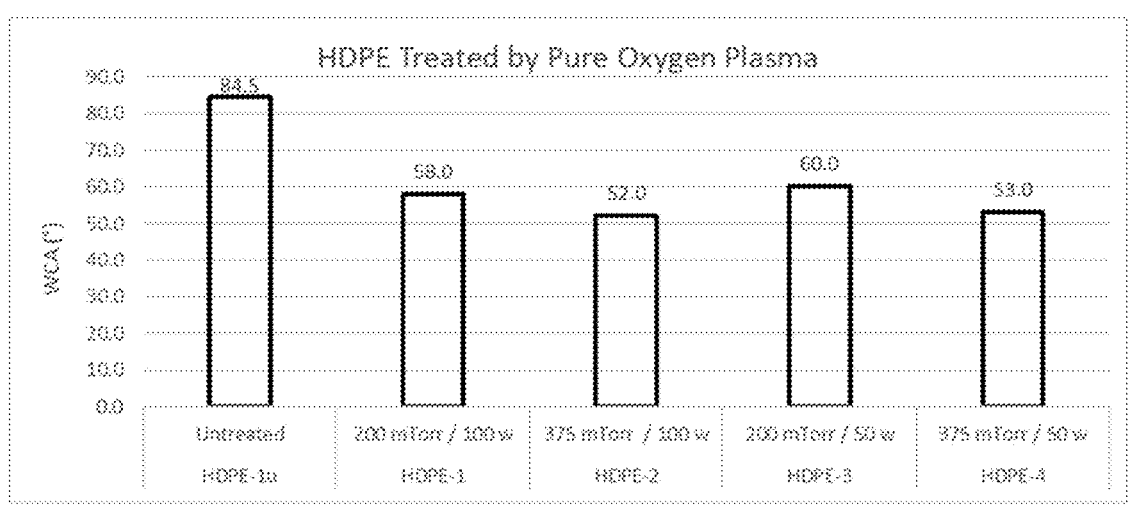
FIGS. 11A-11C, 12A-12C, 13A-13C, and 14A-14C show static WCA data for HDPE, PET, PVDF and PTFE substrates for different plasma treatments, in accordance with some embodiments.
Figure 11B:
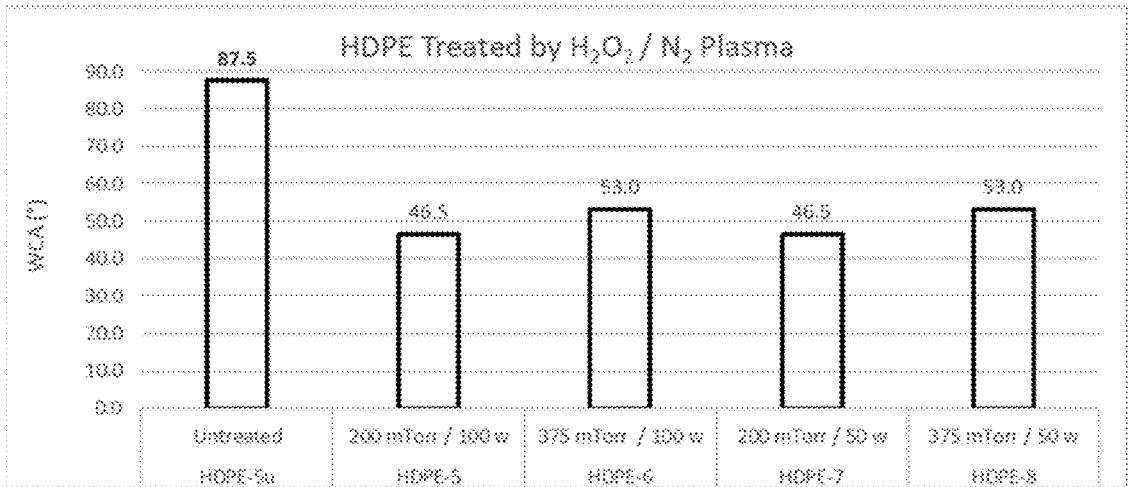
Figure 11C:
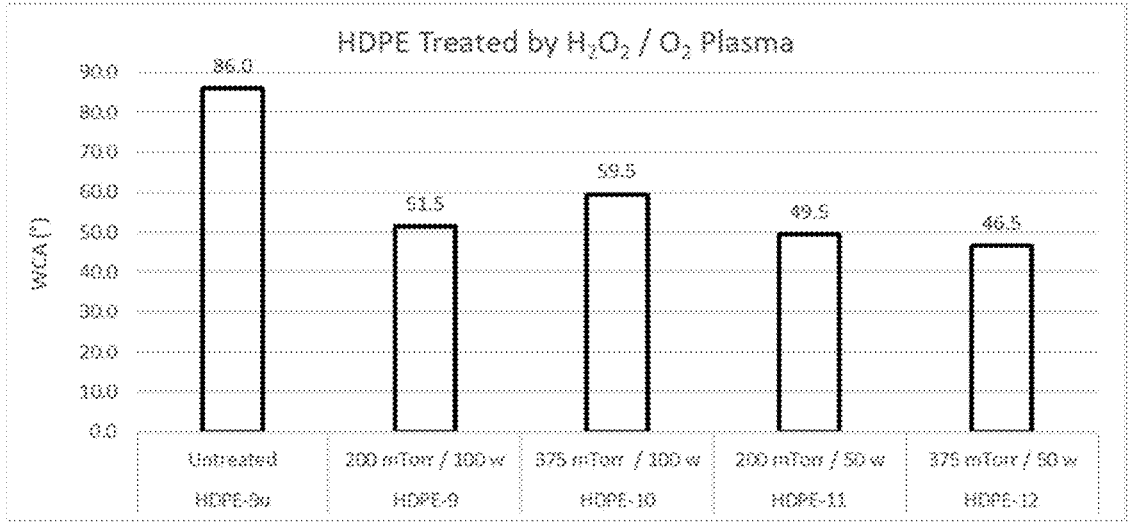

FIGS. 11A-11C each show experimental WCA measurements from HDPE substrates in Example 12 in an untreated state, and after different plasma treatments. The untreated HDPE surfaces have WCAs between 85° and 90° and are therefore relatively hydrophobic. In some cases, "hydrophobic" can be defined as having a WCA range from 65° to 150°, and "hydrophilic" as having a WCA range less than 65°. As used herein, a super-hydrophobic surface has a WCA greater than 150°, and super-hydrophilic surface has a WCA less than approximately 10°, or less than approximately 5°, or less than approximately 1°, or approximately 0°.

FIGS. 11A-11C each show that exposure to the plasmas formed from all three gas blends produced hydrophilic enhancement of HDPE surfaces at all plasma treatment conditions. However, the amount of hydrophilicity improvement varied by condition.

FIG. 11A shows the WCA results for an untreated HDPE substrate, and for HDPE substrates after four plasma treatments using neat (or, "pure") $O_2$ input gas. As known in the art, "neat" (or, "pure") oxygen can have some impurities. For the neat oxygen plasma treatment, a process pressure of 375 mTorr resulted in lower (more hydrophilic) surfaces compared to those at 200 mTorr, while the power setting (50 W or 100 W) made less of a difference.

FIG. 11B shows WCA data for HDPE coupons that were plasma treated with $H_2O_2$ vapor in a nitrogen carrier gas. The lowest of the measured WCA values occurred at the lower pressure of 200 mTorr in this case, and the pressure setting again had a greater impact on the WCA than the power setting. These results show that the WCA values for $H_2O_2/N_2$ plasma treatment at 200 mTorr (both conditions had a WCA of about 46.5°) were lower than those obtained using the neat $O_2$ plasma at 375 mTorr by about 8 degrees, which indicates that the mixed hydrogen peroxide-nitrogen plasma was more effective than the oxygen plasma in creating a hydrophilic surface on HDPE.

FIG. 11C shows WCA data for HDPE coupons that were plasma treated using a hydrogen peroxide plasma with an oxygen carrier gas (i.e., oxygen was used to entrain hydrogen peroxide vapor from a source vessel as an input mixture for the plasma). The $H_2O_2/O_2$ plasma treatment conditions produced mixed results. The lowest measured WCA values among the four conditions was at 50 watts power and 375 mTorr pressure, and the highest values were at 100 watts power and 375 mTorr pressure. With oxygen as a carrier gas, the lower power setting of 50 watts was more effective than 100 watts and 200 mTorr and significantly more effective than at 100 watts and 375 mTorr. However, the highest WCA value using $N_2$ as a carrier gas (per FIG. 11B) was 53.0° at 50 watts and 375 mTorr, whereas using an $O_2$ carrier gas (FIG. 11C) produced a 59.5° value at 100 watts and 375 mTorr, and only one test condition with $O_2$ as a carrier gas produce a WCA value below 47°. For these $H_2O_2$ plasma parameters, using oxygen as a carrier for $H_2O_2$ vapor did not provide lower WCA values than using nitrogen.

The WCA results from Example 12 (FIGS. 11A-11C) show that the $H_2O_2/N_2$ plasma produced the most hydrophilic surfaces of the HDPE, i.e., the 200 mTorr and 50 watts condition produced HDPE with a WCA of 46.31° compared to a WCA of 87.71° for the untreated HDPE. For comparison, the best condition of the oxygen plasma conditions in Example 12 had a WCA of 52.0°, and the best condition of the $H_2O_2/O_2$ plasma conditions in Example 12 had a WCA of 46.5°. Therefore, all of the plasma treatments were capable of increasing the hydrophilicity of the HDPE, however, the $H_2O_2/N_2$ plasma produced the most hydrophilic HDPE surfaces. These WCA results indicate that an abundance of available oxygen does not enhance the plasma performance of $H_2O_2$, with increasing the wettability (i.e., the hydrophilicity) of HDPE as the primary metric.

FTIR spectra were also taken, using attenuated total reflection (ATR) methods, from the HDPE coupons in Example 12 in an untreated state and after the different plasma treatments. The FTIR data can explain what changes have occurred on a molecular level to a sample surface (e.g., at a depth of less than 2 microns). The treated coupons in Example 12 all had both peak shifts and enlargement consistent with C=O stretching.

For example, FTIR spectra from the $H_2O_2/N_2$ plasma treated HDPE showed a peak of interest at 966 cm$^{-1}$. Not to be limited by theory, this absorbance can be caused by C—H out-of-plane wagging, which indicates the formation of a double carbon bond, which was not present in the untreated HDPE. The largest peak, which was at about 966 cm$^{-1}$, resulted from the 100 watt and 200 mTorr $H_2O_2/N_2$ plasma treatment, which coincided with one of the lowest WCAs measured of less than 47 degrees. Not to be limited by theory, the formation of this peak at about 966 cm$^{-1}$ can be evidence that the polyethylene molecule was modified by the plasma treatment, creating double-bonded carbons with single hydrogen atoms that are readily available for reaction and functionalization, provided that sufficient oxidants become available. In some cases, after oxygen exposure the C—O absorbances will become apparent in the 1100-1000 cm$^{-1}$ region on the FTIR spectra.

Figure 12A:
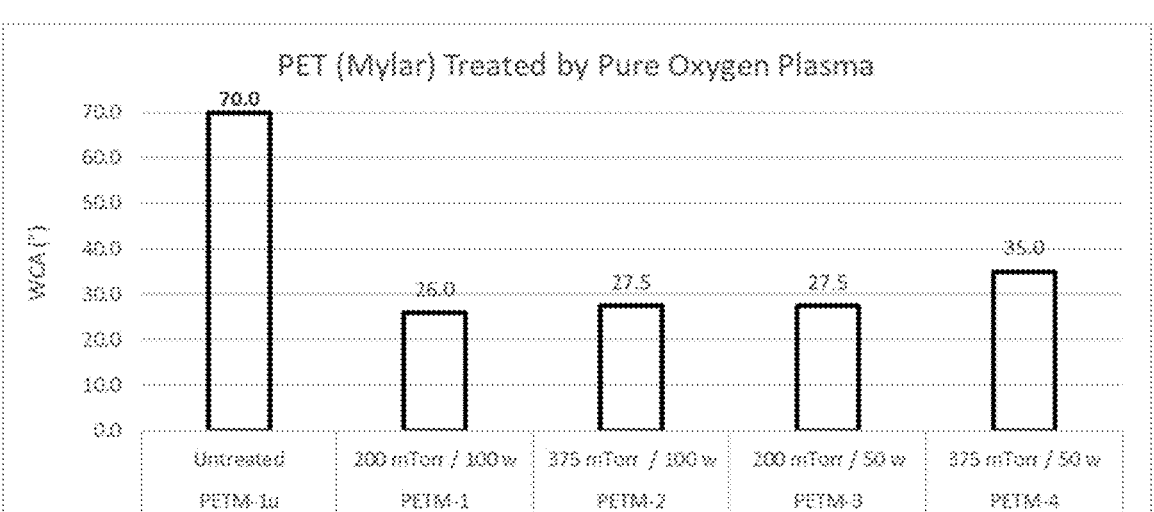
Figure 12B:
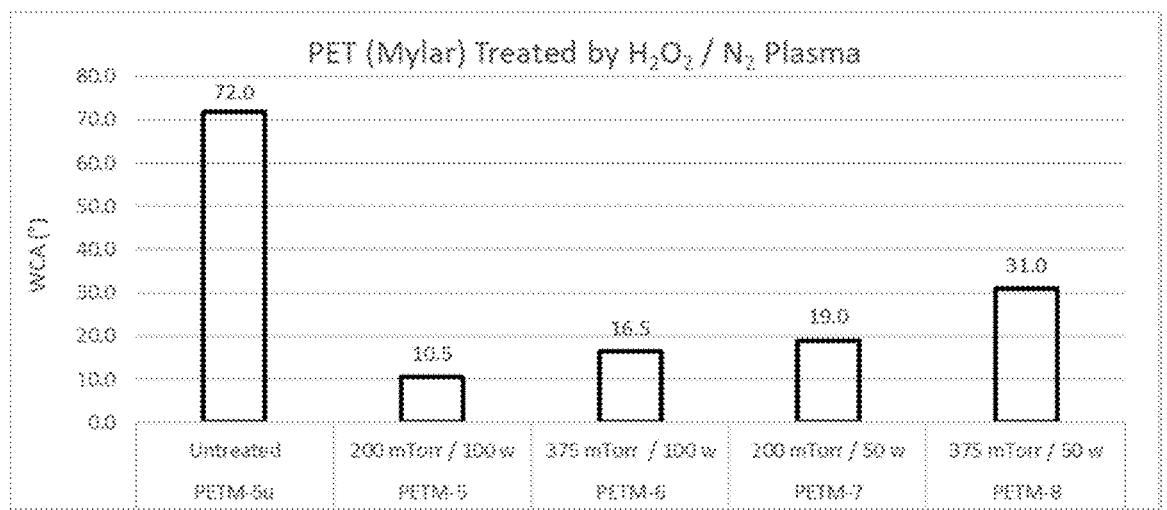
Figure 12C:
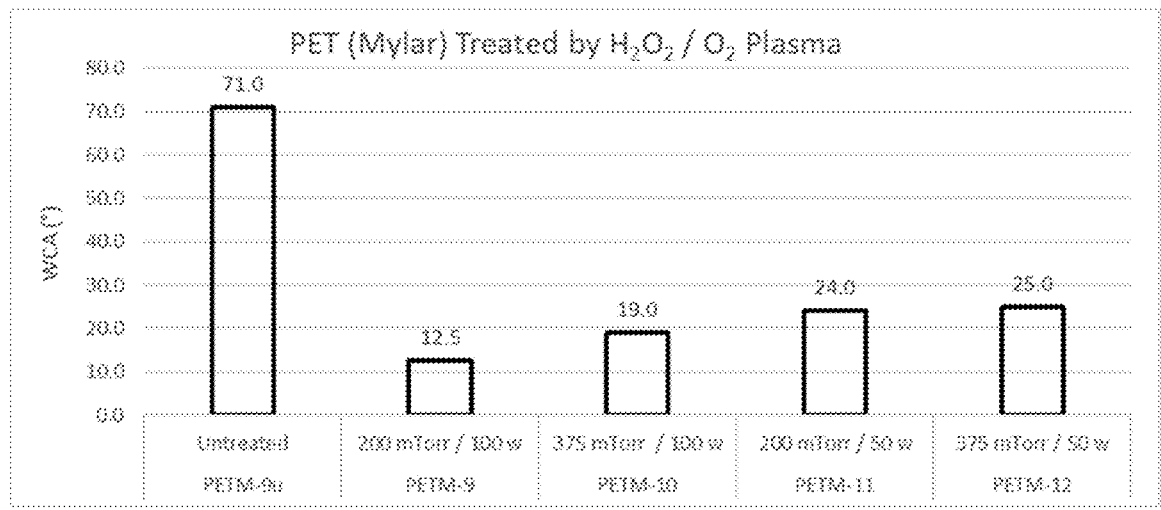

FIGS. 12A-12C show WCA results from PET substrates in Example 13 after different plasma treatments. As with the HDPE substrates in Example 12, 1"×1" coupons were immersed in isopropyl alcohol, rinsed in DI water, and dried in a vacuum oven at 40° C. After cleaning, WCA measurements were taken before plasma treatment. The PET was less hydrophobic than the HDPE, yielding pretreatment WCA values of about 70.0° to 72.0°. The plasma treatments in Example 13 all made the PET substrates more hydrophilic, and the WCAs achieved were also lower than those of the HDPE substrates in Example 12.

FIG. 12A shows that for the $O_2$ plasma, three treatment conditions (both 200 mTorr and 375 mTorr pressure conditions with 100 watts) yielded WCAs in the range from about 26.0° to 28.0°. One condition (375 mTorr and 50 watts) was less effective and had a WCA of 35.0°.

FIG. 12B shows WCA results for PET substrates after exposure to a plasma struck from $H_2O_2$ vapor with a nitrogen carrier gas. The 100 watt and 200 mTorr condition produced a nearly super-hydrophilic surface, with a WCA of 10.0°. The $H_2O_2/N_2$ plasma again produced the lowest WCAs measured for any of the PET plasma conditions, with the two most effective treatments at 100 watts, and the least hydrophilic result occurred at 50 watts and 375 mTorr.

FIG. 12C shows WCA results for PET substrates after exposure to a plasma struck from $H_2O_2$ vapor with an oxygen carrier gas. The WCAs were lower than the oxygen plasma results, but did not produce surfaces with WCAs as low as the best $H_2O_2/N_2$ plasma conditions studied. The pressure and power conditions showed some similar trends to those in the $H_2O_2/N_2$ plasma results in FIG. 12B. Another near super-hydrophilic WCA value was obtained)(12.5°, again for the 200 mTorr and 100 watt condition.

Regardless of the gas/vapor blend, the least effective treatment condition was 50 watt and 375 mTorr for all tests on PET in Example 13, which is one consistency that was not observed with the HDPE treatments in Example 12.

FTIR measurements were also done on the PET substrates in Example 13. C—H symmetrical stretching was observed at 2970 cm-1 for some of the samples that were plasma treated, which could have been due to the four hydrogens bonded to the benzene ring structure. But the CH$_2$ asymmetrical and symmetrical stretch absorbances at 2923 cm$^{-1}$ & 2854 cm$^{-1}$ were not visible on the untreated coupon, nor the coupon treated with oxygen plasma, suggesting a unique alteration at the molecular level by plasma treatment with $H_2O_2/N_2$. Moreover, it was observed that the magnitude of the peaks at 2923 cm$^{-1}$ correspond to the degree of wettability, such as the WCA for the 100 watts and 200 mTorr $H_2O_2/N_2$ plasma treatment, which had the lowest measured WCA values and the largest peak at 2923 cm$^{-1}$, and the 50 watts and 375 mTorr condition, which had the highest WCA and the smallest peaks at 2923 cm$^{-1}$. Not to be limited by theory, since the C—H symmetrical stretch associated with the benzene ring does not show any decrease in magnitude, it is not expected the ring has been opened by the plasma treatment. Rather, the ester groups in the PET monomers may be modified, and/or the terminal chains of the polymeric PET may be modified by the plasma.

A corresponding decrease in the magnitude of C—O stretching was also seen in the FTIR spectra of the plasma treated PET samples in Example 13 (FIGS. 12A-12C). The untreated, $O_2$ plasma treated, and $H_2O_2/N_2$ plasma treated at 50 watts and 375 mTorr coupons had the highest peak magnitudes (at about 1101 $cm^{-1}$ and 1124 $cm^{-1}$), which would be indicative of more unaltered C—O bonds in the polymer. This is consistent with the WCA data, which showed that the 375 mTorr and 50 watts $H_2O_2/N_2$ plasma condition produced the least hydrophilic PET surface of the peroxide treatments. The neat $O_2$ plasma at 100 watts and 200 mTorr had the lowest measured WCA value of the pure oxygen treatments, but it apparently was not as effective in reacting with the C—O bonds in PET as $H_2O_2$ in an $N_2$ carrier, nor were decreasing C—O absorbances observed in the FTIR spectra from the PET substrates after plasma treatment using $H_2O_2$ with $O_2$ as a carrier. With oxygen as a carrier gas for the hydrogen peroxide plasmas, some C—O absorbances even had greater magnitude than the untreated samples.

To summarize the WCA results of Examples 12 and 13, plasma treatments using neat oxygen as well as hydrogen peroxide vapor in both $N_2$ and $O_2$ carrier gases rendered all HDPE and PET surfaces more hydrophilic. Overall, PET attained higher hydrophilicity than HDPE by the plasma treatments, and PET was also more hydrophilic than HDPE before treatment. (Not to be limited by theory, this may be because it is known that the wettability of a polymer increases directly with oxygen content, where higher O/C ratio materials are more hydrophilic.) The lowest measured WCA value) (10.28°) was obtained on PET with $H_2O_2$ vapor in an $N_2$ carrier gas, at an RF power of 100 watts and pressure of 200 mTorr. For the $H_2O_2/N_2$ plasma treatments, surface wettability (or hydrophilicity) was greatest at a pressure of 200 mTorr for HDPE, regardless of the RF power setting. Yet for PET, surface wettability was greatest when plasma treated at 100 watts, regardless of process pressure. Based on the WCA values in Examples 12 and 13, using oxygen as a carrier gas for delivering $H_2O_2$ from the hydrogen peroxide vessel (as described herein) to the plasma either did not perform as well as, or provided no additional benefit over, using a nitrogen carrier gas.

Figure 13A:
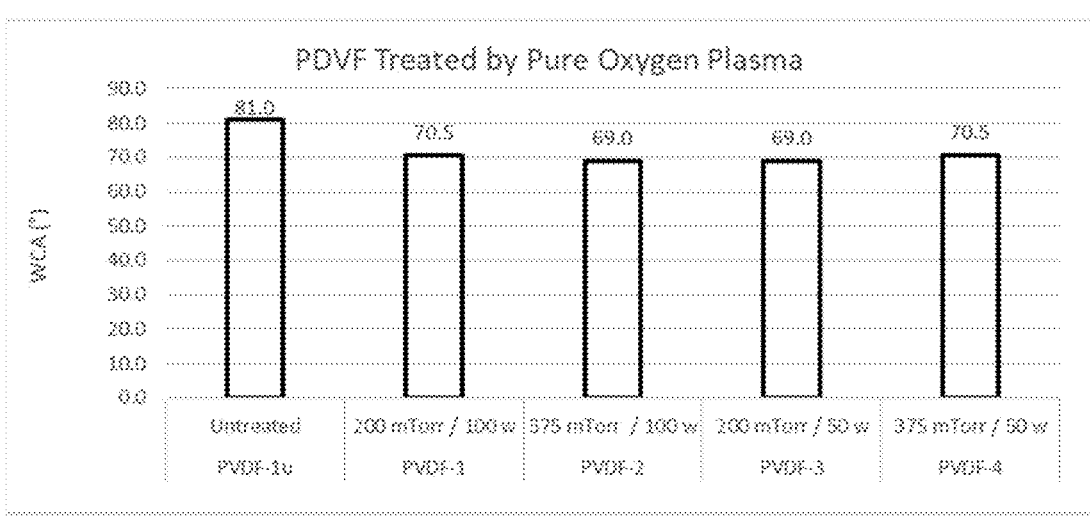
Figure 13B:
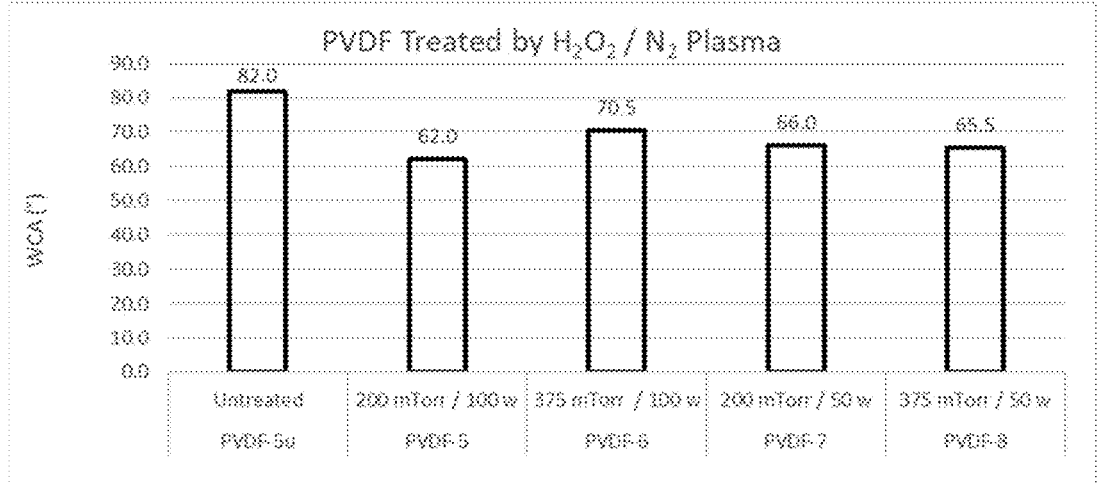
Figure 13C:
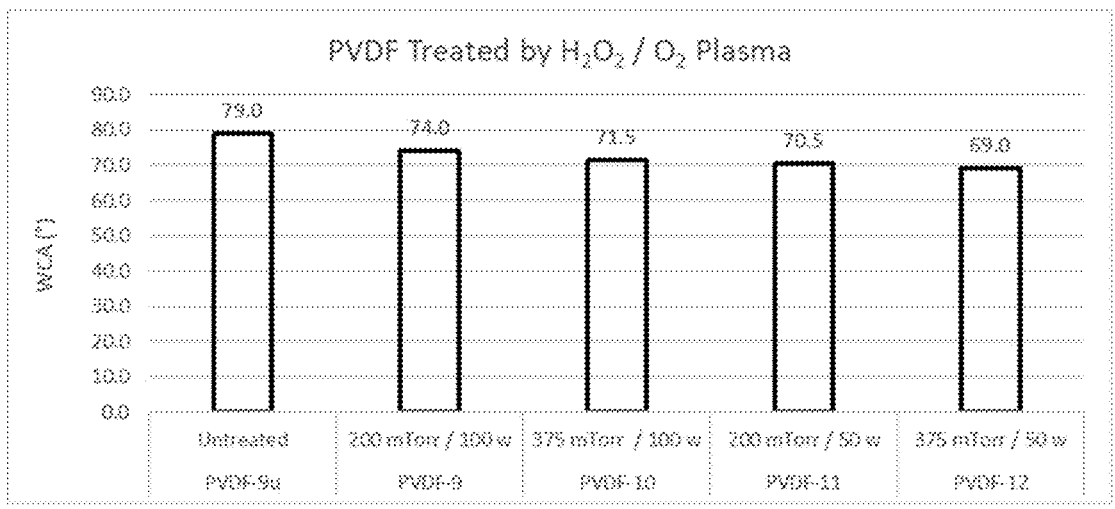

FIGS. 13A-13C show WCA results from PVDF substrates in Example 14 after different plasma treatments. As with the previous polymeric substrates in Examples 12 and 13, WCA measurements of coupons were taken before and after different plasma treatments. The PVDF was relatively hydrophobic and had pretreatment WCA values of about 79.0° to 82.0°. The plasma treatments in Example 14 all made the PVDF substrates more hydrophilic, although the WCAs achieved for PVDF were not as low as those for HDPE or PET (in Examples 12 and 13). The pressure and power did not considerably affect the WCA for the oxygen plasma conditions in FIG. 13A. Some trends in pressure and power can be seen for the WCAs after $H_2O_2/N_2$ plasma in FIG. 13B, with the 200 mTorr and 100 watts condition yielding the lowest measured WCA) (61.80°) for any of the PVDF substrates in Example 14. The $H_2O_2/O_2$ plasma in FIG. 13C yielded higher WCAs at all conditions compared to the $H_2O_2/N_2$ plasma in FIG. 13B. These results show that a $H_2O_2/N_2$ plasma can be used to significantly increase the hydrophilicity of PVDF and reduce the WCA from about 82.0° down to about 62.0°.

Figure 14A:
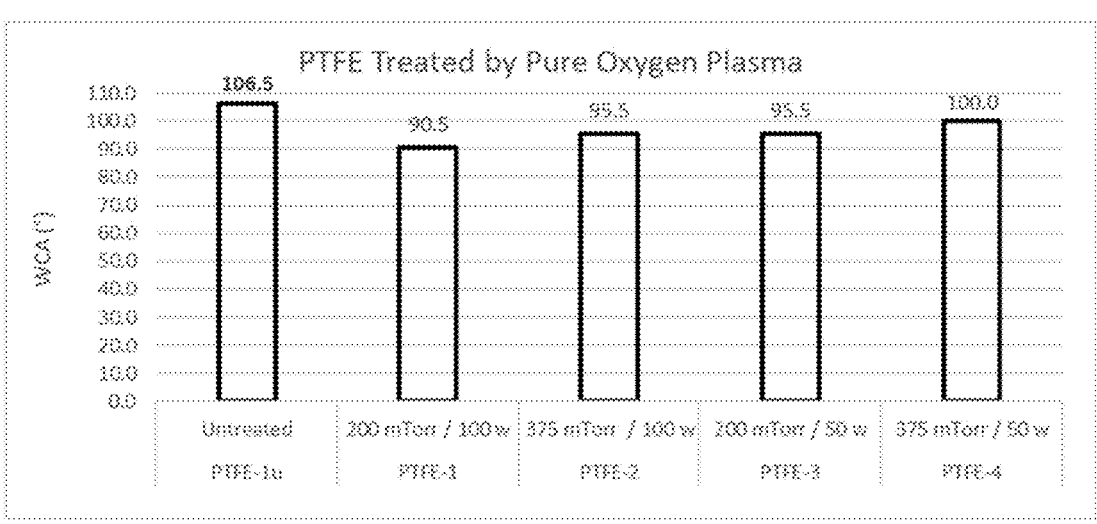
Figure 14B:
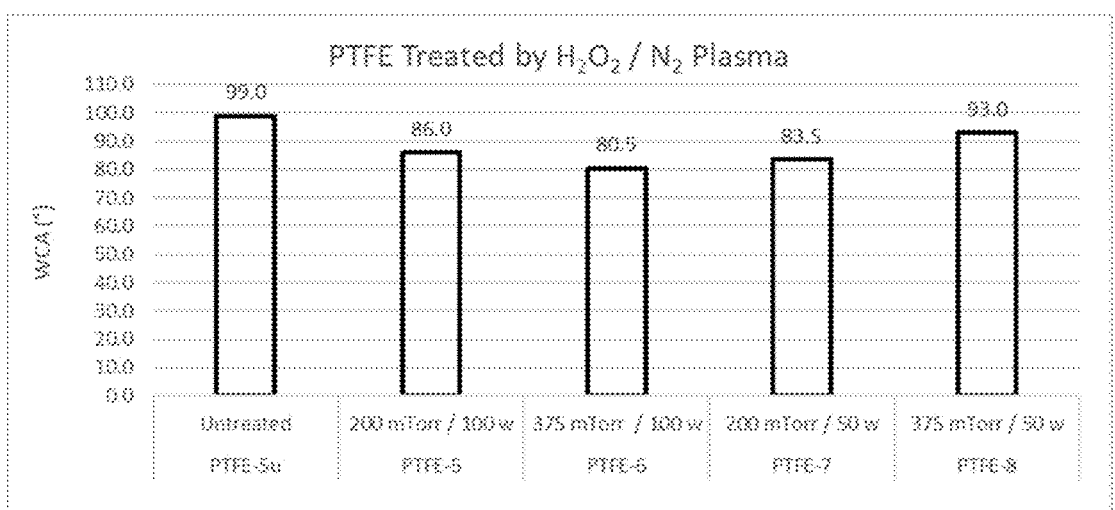
Figure 14C:
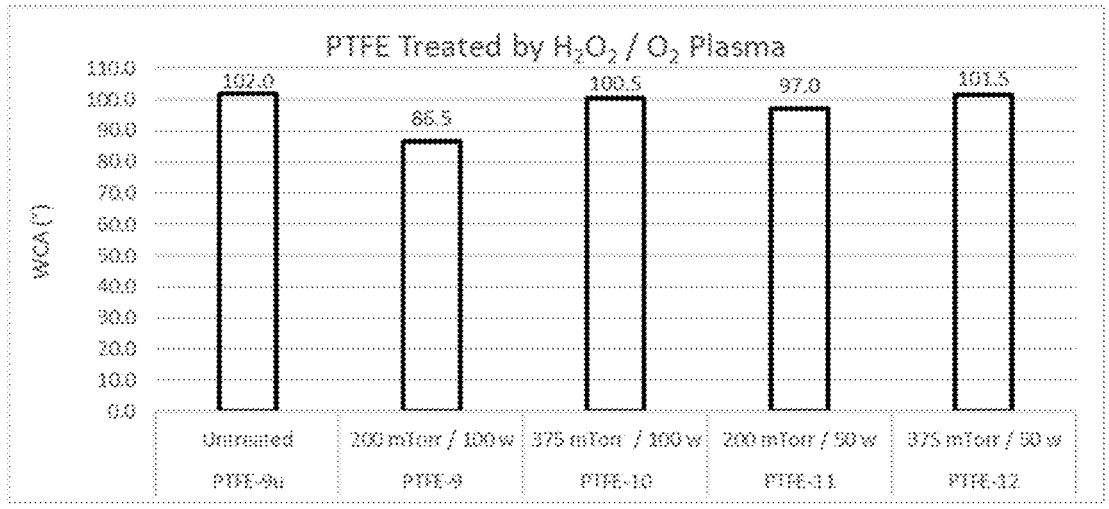

FIGS. 14A-14C show WCA results from PTFE substrates in Example 15 after different plasma treatments. As with the previous polymeric substrates in Examples 12-14, WCA measurements of coupons were taken before and after different plasma treatments. The PTFE was the most hydrophobic polymeric substrate tested and had pretreatment WCA values of about 99.0° to 106.5°. The plasma treatments in Example 15 were all capable of making the PTFE substrates more hydrophilic, although the post-treatment WCAs for PTFE were also the highest of any of the polymeric substrates tested in Examples 12-15. Some trends in pressure and power can be seen for the WCAs for each of the plasmas. The WCAs obtained using the $H_2O_2/N_2$ plasma shown in FIG. 14B again yielded the lowest measured WCA on PTFE. The 375 mTorr and 100 watts condition yielded a WCA of 80.5°, which was the lowest for any of the conditions on PTFE in Example 15. The $H_2O_2/O_2$ plasma in FIG. 14C yielded higher WCAs at all conditions compared to the $H_2O_2/N_2$ plasma in FIG. 14B. These results show that a $H_2O_2/N_2$ plasma can be used to significantly increase the hydrophilicity of PTFE and reduce the WCA from about 99.0° down to about 80.5°.

In Examples 1-11 using silicon substrates and in Examples 12-15 using polymeric substrates, the most hydrophilic surfaces were produced using the hydrogen peroxide plasma with a nitrogen carrier gas. In Examples 1-15, both the hydrogen peroxide plasma formed using an oxygen carrier gas and the oxygen plasma treatments produced surfaces that were not as hydrophilic as those produced by the hydrogen peroxide plasma with nitrogen carrier gas. Therefore, not to be limited by theory, oxygen radicals present in plasmas may contribute to a lower hydrophilicity. Oxygen radicals can not only form oxides on the surface, but can also penetrate into the material (i.e., into a subsurface of the material) being treated thereby creating a thicker oxide layer (i.e., not just a monolayer on the surface). The oxides and other oxygen ligands created by the oxygen radicals which are not as hydrophilic as hydroxyls reduce available hydroxyl sites.

In some embodiments of the systems and methods described herein, a surface of a material (e.g., silicon or polymer) is exposed to (or treated with) a hydrogen peroxide plasma, and the surface and/or the subsurface of the material is not oxidized by the plasma (or is minimally oxidized by the plasma).

Spectral changes detected by FTIR-ATR on the plasma-treated coupons (e.g., in Examples 12 and 13) were subtle and difficult to quantify. Qualitatively, C—O stretch at the 1124 $cm^{-1}$, 1101 $cm^{-1}$, and 1021 $cm^{-1}$ positions in the FTIR spectra were reduced from untreated to $O_2$ plasma, and were minimized with $H_2O_2$ plasma without $O_2$ addition. This may be indicative of conversion of C—O compounds to C-hydroxyl group bonding. Small peaks seen on plasma exposed materials indicated possible hydrophilic bonding to the surface.

Methods

Figure 15:
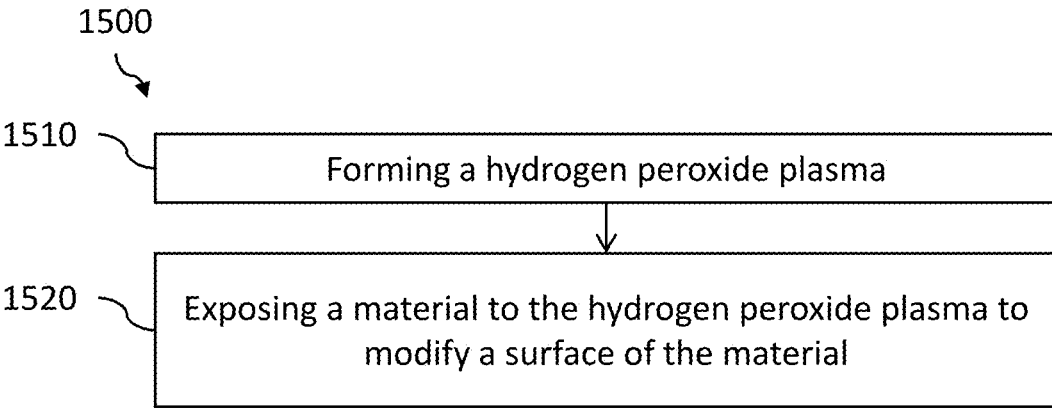
FIGS. 15 and 16 are flowcharts of methods for modifying a surface of a substrate using a hydrogen peroxide plasma, in accordance with some embodiments.

FIG. 15 is a flowchart of a method 1500 for modifying a surface of a material using a hydrogen peroxide plasma. Method 1500 can be performed using system 100, or a similar system. In block 1510, a hydrogen peroxide plasma is formed. The hydrogen peroxide plasma can be formed in a chamber. For example, a mixture of a hydrogen peroxide vapor and a carrier gas can be added to a plasma chamber. In some cases, forming the hydrogen peroxide in the chamber can comprise forming the hydrogen peroxide plasma in a remote plasma source, and then introducing the hydrogen peroxide plasma into the chamber. The carrier gas can include many different species such as an inert gas (e.g., a noble gas, argon, helium, etc.), nitrogen, CDA, hydrogen, or mixtures thereof. The mixture of the hydrogen peroxide vapor and the carrier gas can comprise less than 10% water by weight and less than 1% oxygen by weight (or can include any of the hydrogen peroxide materials described herein). The concentration of hydrogen peroxide vapor in the mixture can be substantially stable over time, as described herein. The hydrogen peroxide can be anhydrous, in some cases. The mixture of the hydrogen peroxide vapor and the carrier gas can have less than 60% water by weight, or less than 10% water by weight, or less than 0/1% water by weight, in some cases. The mixture of the hydrogen peroxide vapor and the carrier gas can have less than 1% oxygen by weight, or be substantially free of oxygen, in some cases. In block 1520, a material (e.g., a silicon material, a material with or without additional layers, or a polymeric material) is exposed to the hydrogen peroxide plasma, to modify a surface of the material. In some cases, the material is exposed to the hydrogen peroxide plasma in a chamber. The hydrogen peroxide plasma can modify the material surface by forming a layer of hydroxyl groups on the material surface. In some cases, a high-density layer of hydroxyl groups is formed on the material surface. The hydrophilicity of the material can be increased using method 1500. For example, a WCA measurement of the material can show a decrease in contact angle as a result of performing method 1500. In some cases, hydroxyl groups can be formed on the surface(s) of a material as a result of performing method 1500, causing one or more surfaces of the material to become more hydrophilic. In some cases, after performing method 1500, one or more surfaces of the material have a WCA less than about 15 degrees, or less than about 10 degrees, or less than about 5 degrees.

Figure 16:
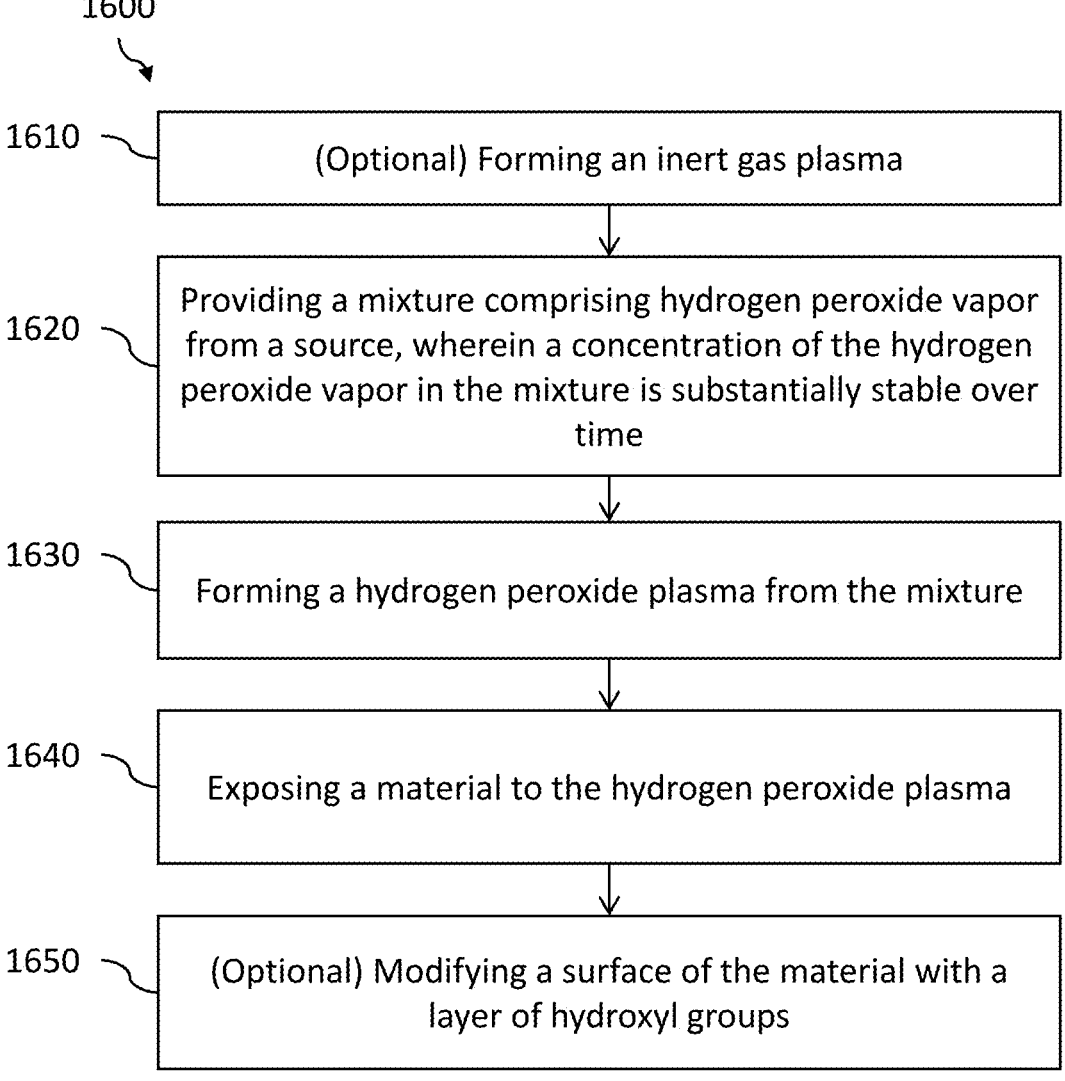

FIG. 16 is a flowchart of a method 1600 for modifying a surface of a material using a hydrogen peroxide plasma. Method 1600 can be performed using system 100, or a similar system. In optional block 1610, an inert gas plasma is formed, for example, in a chamber. In some cases, the inert gas plasma may be formed in a remote plasma source, and the inert gas plasma can then be introduced into the chamber. In block 1620, a mixture of hydrogen peroxide vapor is provided from a source (e.g., hydrogen peroxide source 150 in FIG. 1A). The mixture of hydrogen peroxide vapor can include primarily hydrogen peroxide vapor. For example, the mixture can include hydrogen peroxide vapor and a small concentration (e.g., less than 10%, or less than 1%, or less than 0.1%) of water and/or oxygen. In another example, the mixture can include hydrogen peroxide vapor and other components (e.g., water, or a carrier gas) at higher concentrations (e.g., up to 60%, or even higher in the case of a mixture of hydrogen peroxide vapor and a carrier gas). A concentration of the hydrogen peroxide vapor in the mixture provided from the source can be substantially stable over time. In block 1630, a hydrogen peroxide plasma is formed, for example, in a plasma source that is coupled to a chamber. In the case that an inert gas plasma was formed first, then the hydrogen peroxide plasma can be formed in step 1630 by adding the mixture of the hydrogen peroxide vapor and the carrier gas to the inert gas plasma. In some cases, the hydrogen peroxide plasma may be formed in a remote plasma source, and the hydrogen peroxide plasma can then be introduced into the chamber. The carrier gas can include many different species such as an inert gas (e.g., a noble gas, argon, helium, etc.), nitrogen, CDA, hydrogen, or mixtures thereof. The hydrogen peroxide vapor and the carrier gas in the source (and in the stream from the source) can each comprise less than 10% water by weight and less than 1% oxygen by weight (or can include any of the hydrogen peroxide materials described herein). The hydrogen peroxide can be anhydrous, in some cases. The mixture of the hydrogen peroxide vapor and the carrier gas can be substantially free of oxygen, in some cases. However, some oxygen may be present in the resulting plasma due to decomposition of hydrogen peroxide into water and oxygen within the plasma. In block 1640, a material is exposed to the hydrogen peroxide plasma (e.g., in the chamber). The material can be silicon or a polymeric material (e.g., plastic, UHMWPE or PEEK). In optional block 1650, a surface of the material is modified with a layer of hydroxyl groups. In some cases, a high-density layer of hydroxyl groups is formed on the material surface. The hydrophilicity of the material can be increased using method 1600. For example, a WCA measurement can show a decrease in contact angle of the material as a result of performing method 1600.

In some cases, the flow rate of the inert gas used to form the inert gas plasma in block 1610 is significantly lower than the flow rate of the mixed hydrogen peroxide and carrier gas used to form the hydrogen peroxide plasma in block 1630. For example, the flow rate of the inert gas used to form the inert gas plasma in block 1610 can be half, a fifth, a tenth, a twentieth, or a hundredth of the flow rate of the mixed hydrogen peroxide and carrier gas used to form the hydrogen peroxide plasma in block 1630.

In some cases, the material is added to the chamber, and then the hydrogen peroxide plasma is subsequently introduced into the chamber. For example, in some cases it can be beneficial to allow flow patterns of gases within the chamber to stabilize before adding the hydrogen peroxide plasma to the chamber.

In some cases of method 1600, the material is a substrate, or a layered structure comprising a thin film. In some cases of method 1600, for example due to the low oxygen content in the hydrogen peroxide vapor and carrier gas, surface(s) of the material exposed to the hydrogen peroxide plasma do not form $SiO_2$ or siloxane from the plasma. For example, in some cases, after block 1640 the surface(s) can contain no $SiO_2$ or siloxane or no measurable amount of $SiO_2$ or siloxane (e.g., using a surface characterization technique such as x-ray photoelectron spectroscopy (XPS)). In some cases of method 1600, for example due to the low oxygen content in the hydrogen peroxide vapor and carrier gas, the surface(s) does not form C—O or C═O bonds from the plasma. For example, in some cases, the surface(s) after block 1630 can contain no C—O or C—O bonds, or no measurable amount of C—O or C—O bonds (e.g., using a surface characterization technique such as XPS).

In some cases, measuring the bond character at the surface may be difficult, for example, if the concentration at the surface is below a level of detection of a surface analysis technique. In some cases, after performing a method described herein (e.g., method 1500 or 1600) a surface of the material does not substantially form $SiO_2$ from exposing the material to the hydrogen peroxide plasma. In some cases, after performing a method described herein (e.g., method 1500 or 1600) a surface of the material does not substantially form C—O or C—O bonds from the exposing the material to the hydrogen peroxide plasma. In some cases, after performing a method described herein (e.g., method 1500 or 1600) a subsurface of the material is not substantially oxidized by the exposing the material to the hydrogen peroxide plasma. As used above, the phrase "not substantially" indicates that the concentration of species described above is below a level of detection of a surface analysis technique. For example, a surface of the material does not substantially form $SiO_2$ from exposing the material to the hydrogen peroxide plasma if the concentration of $SiO_2$ at the surface of the material is below the detection limit after the exposing the material to the hydrogen peroxide plasma. Not to be limited by theory, replacing hydroxyl groups on a surface of a material with SiO₂, siloxane, C—O or C—O bonds will increase the surface energy and make the material surface less hydrophilic.

Additionally, surfaces can be modified by an ambient atmosphere when removed from the plasma chamber, and therefore special equipment (e.g., an integrated characterization tool) may be necessary to avoid exposure to atmosphere after exposing the material to the hydrogen peroxide plasma as described herein (e.g., in methods 1500 or 1600) and obtain an accurate measurement of the bond character at the surface. For example, heat, humidity, atmospheric contaminants, and even volatile components of plastic boxes or bags housing samples can modify a surface after it has been removed from a treatment chamber and exposed to an outside environment. Additionally, in some cases the character of a surface may change over time even within a low pressure (or vacuum) environment. For example, a hydroxylated surface of some polymer materials can degrade (or become less hydrophilic) over time due to reactions with molecules of the polymer itself. Therefore, in order to obtain an accurate measurement of the effect of a hydrogen peroxide plasma treatment on a material surface, it may be necessary to measure the hydrophilicity of the surface within a certain amount of time (e.g., within an hour, or within 10 min, or within a few seconds) depending on the atmosphere and conditions to which it is exposed, and on the type of material.

EMBODIMENTS

Clause 1. A method comprising: providing a mixture comprising hydrogen peroxide vapor from a source, wherein a concentration of the hydrogen peroxide vapor in the mixture is substantially stable over time; forming a hydrogen peroxide plasma from the mixture; and exposing a material to the hydrogen peroxide plasma in a chamber.

Clause 2. The method of clause 1, wherein the exposing the material to the hydrogen peroxide plasma in the chamber increases a hydrophilicity of a surface of the material.

Clause 3. The method of clause 1, wherein the material is a substrate, or a layered structure comprising a thin film.

Clause 4. The method of clause 1, wherein the material is a substrate comprising silicon.

Clause 5. The method of clause 4, wherein the method further comprises dipping the substrate in a buffered HF solution before the exposing the substrate to the hydrogen peroxide plasma.

Clause 6. The method of clause 1, wherein the material comprises a polymeric material, ultra-high molecular weight polyethylene (UHMWPE), polyethylene terephthalate (PET), polytetrafluoroethylene (PTFE), or polyether ether ketone (PEEK).

Clause 7. The method of clause 1, wherein a surface of the material does not substantially form SiO₂ from the exposing the material to the hydrogen peroxide plasma.

Clause 8. The method of clause 1, wherein a surface of the material does not substantially form C—O bonds, C=O bonds, or CO₂ gas, from the exposing the material to the hydrogen peroxide plasma.

Clause 9. The method of clause 1, wherein a subsurface of the material is not substantially oxidized by the exposing the material to the hydrogen peroxide plasma.

Clause 10. The method of clause 1, wherein a roughness of the material is not substantially increased by the exposing the material to the hydrogen peroxide plasma.

Clause 11. The method of clause 1, wherein the mixture comprises less than 60% water by weight at the source.

Clause 12. The method of clause 1, wherein the mixture comprises less than 10% water by weight at the source.

Clause 13. The method of clause 1, wherein the mixture comprises less than 0.1% water by weight at the source.

Clause 14. The method of clause 1, wherein the mixture comprises less than 1% oxygen by weight at the source.

Clause 15. The method of clause 1, wherein the mixture further comprises a carrier gas, and wherein the carrier gas comprises one or more of an inert gas, hydrogen, or nitrogen.

Clause 16. The method of clause 1, wherein the providing the mixture comprising the hydrogen peroxide vapor from the source further comprises directly drawing the mixture from the source using a vacuum.

Clause 17. The method of clause 1, further comprising introducing the material into the chamber before the exposing the material to the hydrogen peroxide plasma in the chamber.

Clause 18. The method of clause 1, wherein the exposing the material to the hydrogen peroxide plasma in the chamber causes a surface of the material to have a static water contact angle less than about 15 degrees.

Clause 19. The method of clause 1, wherein exposed surfaces of the material comprise a rough surface, pits, or holes, and wherein exposing the material to the hydrogen peroxide plasma in the chamber causes the exposed surfaces of the material to become more hydrophilic.

Clause 20. The method of clause 1, wherein the material is exposed to the hydrogen peroxide plasma for about 5 minutes, and wherein a pressure in the chamber is about 5 Torr during the exposing.

Clause 21. The method of clause 1, further comprising forming an inert gas plasma before forming the hydrogen peroxide plasma, wherein the forming the hydrogen peroxide plasma from the mixture comprises adding the mixture to the inert gas plasma.

Reference has been made in detail to embodiments of the disclosed invention, one or more examples of which have been illustrated in the accompanying figures. Each example has been provided by way of explanation of the present technology, not as a limitation of the present technology. In fact, while the specification has been described in detail with respect to specific embodiments of the invention, it will be appreciated that those skilled in the art, upon attaining an understanding of the foregoing, may readily conceive of alterations to, variations of, and equivalents to these embodiments. For instance, features illustrated or described as part of one embodiment may be used with another embodiment to yield a still further embodiment. Thus, it is intended that the present subject matter covers all such modifications and variations within the scope of the appended claims and their equivalents. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only, and is not intended to limit the invention.

Although the invention has been described with reference to the above example, it will be understood that modifications and variations are encompassed within the scope of the invention. Accordingly, the invention is limited only by the following claims.

What is claimed is:

1. A method comprising:

providing a mixture comprising hydrogen peroxide vapor from a source, wherein a concentration of the hydrogen peroxide vapor in the mixture is substantially stable over time;

forming a hydrogen peroxide plasma from the mixture; and exposing a material to the hydrogen peroxide plasma in a chamber, wherein the material is a semiconductor substrate comprising silicon.

2. The method of claim 1, wherein the exposing the material to the hydrogen peroxide plasma in the chamber increases a hydrophilicity of a surface of the material.

3. The method of claim 1, wherein the material is a substrate, or a layered structure comprising a thin film.

4. The method of claim 1, wherein the method further comprises dipping the semiconductor substrate in a buffered HF solution before the exposing the substrate to the hydrogen peroxide plasma.

5. The method of claim 1, wherein a surface of the material does not substantially form SiO2 from the exposing the material to the hydrogen peroxide plasma.

6. The method of claim 1, wherein a subsurface of the material is not substantially oxidized by the exposing the material to the hydrogen peroxide plasma.

7. The method of claim 1, wherein a roughness of the material is not substantially increased by the exposing the material to the hydrogen peroxide plasma.

8. The method of claim 1, wherein the mixture comprises less than 60% water by weight at the source.

9. The method of claim 1, wherein the mixture comprises less than 10% water by weight at the source.

10. The method of claim 1, wherein the mixture comprises less than 0.1% water by weight at the source.

11. The method of claim 1, wherein the mixture comprises less than 1% oxygen by weight at the source.

12. The method of claim 1, wherein the mixture further comprises a carrier gas, and wherein the carrier gas comprises one or more of an inert gas, hydrogen, or nitrogen.

13. The method of claim 1, wherein the providing the mixture comprising the hydrogen peroxide vapor from the source further comprises directly drawing the mixture from the source using a vacuum.

14. The method of claim 1, further comprising introducing the material into the chamber before the exposing the material to the hydrogen peroxide plasma in the chamber.

15. The method of claim 1, wherein the exposing the material to the hydrogen peroxide plasma in the chamber causes a surface of the material to have a static water contact angle less than about 15 degrees.

16. The method of claim 1, wherein exposed surfaces of the material comprise a rough surface, pits, or holes, and wherein exposing the material to the hydrogen peroxide plasma in the chamber causes the exposed surfaces of the material to become more hydrophilic.

17. The method of claim 1, wherein the material is exposed to the hydrogen peroxide plasma for about 5 minutes, and wherein a pressure in the chamber is about 5 Torr during the exposing.

18. The method of claim 1, further comprising forming an inert gas plasma before forming the hydrogen peroxide plasma, wherein the forming the hydrogen peroxide plasma from the mixture comprises adding the mixture to the inert gas plasma.

\* \* \* \* \*